United States Patent
Choi et al.

(10) Patent No.: US 12,183,664 B2
(45) Date of Patent: Dec. 31, 2024

(54) SEMICONDUCTOR PACKAGE

(71) Applicant: Samsung Electronics Co., Ltd., Suwon-si (KR)

(72) Inventors: Ju-Il Choi, Seongnam-si (KR); Gyuho Kang, Cheonan-si (KR); Seong-Hoon Bae, Cheonan-si (KR); Jin Ho An, Seoul (KR); Jeonggi Jin, Seoul (KR); Atsushi Fujisaki, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 232 days.

(21) Appl. No.: 17/381,869

(22) Filed: Jul. 21, 2021

(65) Prior Publication Data

US 2022/0157702 A1 May 19, 2022

(30) Foreign Application Priority Data

Nov. 17, 2020 (KR) .................. 10-2020-0153664

(51) Int. Cl.
*H01L 23/498* (2006.01)
*H01L 23/00* (2006.01)
(Continued)

(52) U.S. Cl.
CPC .. *H01L 23/49816* (2013.01); *H01L 23/49822* (2013.01); *H01L 23/49833* (2013.01); *H01L 23/49838* (2013.01); *H01L 23/5385* (2013.01); *H01L 23/5386* (2013.01); *H01L 24/16* (2013.01); *H01L 24/73* (2013.01); *H01L 25/0652* (2013.01); *H01L 25/105* (2013.01); *H01L 2224/0401* (2013.01); *H01L 2224/16147* (2013.01); *H01L 2224/16235* (2013.01); *H01L 2224/73204* (2013.01); *H01L 2225/06513* (2013.01); *H01L 2225/06517* (2013.01); *H01L 2225/0652* (2013.01); *H01L 2225/06524* (2013.01); *H01L 2225/06541* (2013.01); *H01L 2225/06548* (2013.01);
(Continued)

(58) Field of Classification Search
CPC ......... H01L 23/49816; H01L 23/49822; H01L 23/49833
See application file for complete search history.

(56) References Cited

U.S. PATENT DOCUMENTS 8,304,766 B2   11/2012   Lin et al.
9,831,195 B1 *  11/2017   Lu ........................... H01L 23/13
(Continued)

FOREIGN PATENT DOCUMENTS

JP    2000269277 A    9/2000
KR    101707931 B1    2/2017

*Primary Examiner* — Errol V Fernandes
(74) *Attorney, Agent, or Firm* — Muir Patent Law, PLLC

(57) ABSTRACT

A semiconductor package may include a redistribution substrate, a semiconductor chip mounted on a top surface of the redistribution substrate, and a conductive terminal provided on a bottom surface of the redistribution substrate. The redistribution substrate may include an under-bump pattern including a via portion in contact with the conductive terminal and a wire portion on the via portion and an insulating layer covering top and side surfaces of the under-bump pattern. A central portion of a bottom surface of the via portion may be provided at a level higher than an edge portion of the bottom surface of the via portion.

17 Claims, 21 Drawing Sheets

(51) Int. Cl.
*H01L 23/538* (2006.01)
*H01L 25/065* (2023.01)
*H01L 25/10* (2006.01)

(52) U.S. Cl.
CPC ............. *H01L 2225/1023* (2013.01); *H01L 2225/1041* (2013.01); *H01L 2225/107* (2013.01); *H01L 2924/1431* (2013.01); *H01L 2924/1434* (2013.01)

(56) References Cited

U.S. PATENT DOCUMENTS

| | | |
|---|---|---|
| 10,002,848 B1 | 6/2018 | Lin et al. |
| 10,290,604 B2 | 5/2019 | Huang et al. |
| 10,658,315 B2 | 5/2020 | Bih et al. |
| 10,665,535 B2 | 5/2020 | Lee et al. |
| 2009/0166396 A1* | 7/2009 | Supriya ............... H01L 24/11 228/179.1 |
| 2012/0018876 A1* | 1/2012 | Wu ..................... H01L 23/3157 257/E21.597 |
| 2013/0320522 A1 | 12/2013 | Lai et al. |
| 2016/0372430 A1* | 12/2016 | Arvin ................. H01L 24/13 |
| 2017/0084558 A1* | 3/2017 | Seo .................... H01L 24/11 |
| 2021/0202412 A1* | 7/2021 | Shih .................. H01L 21/76831 |

* cited by examiner

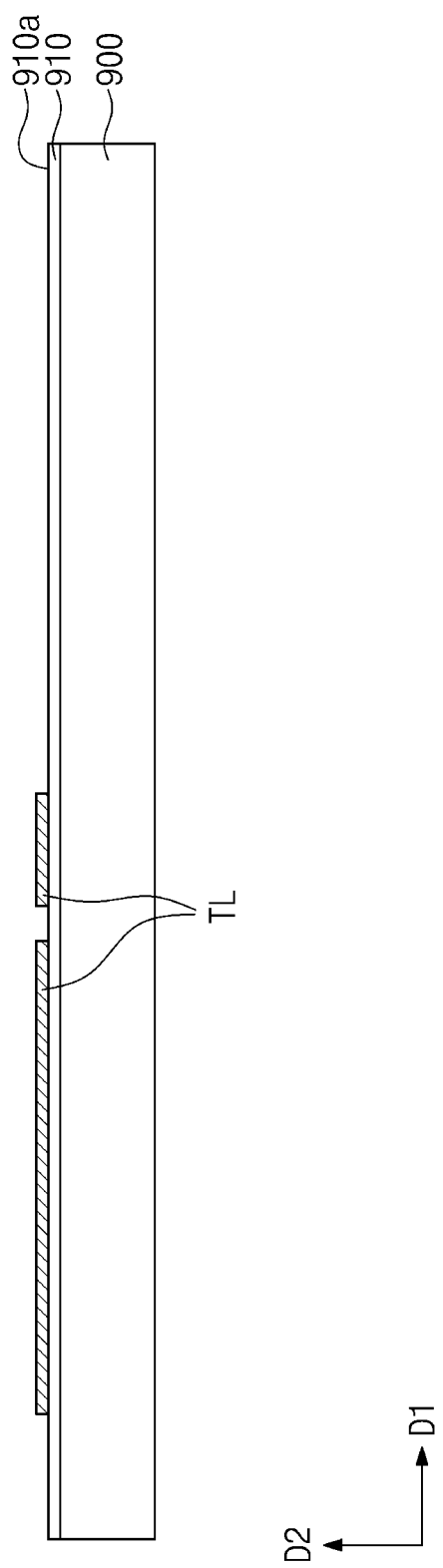

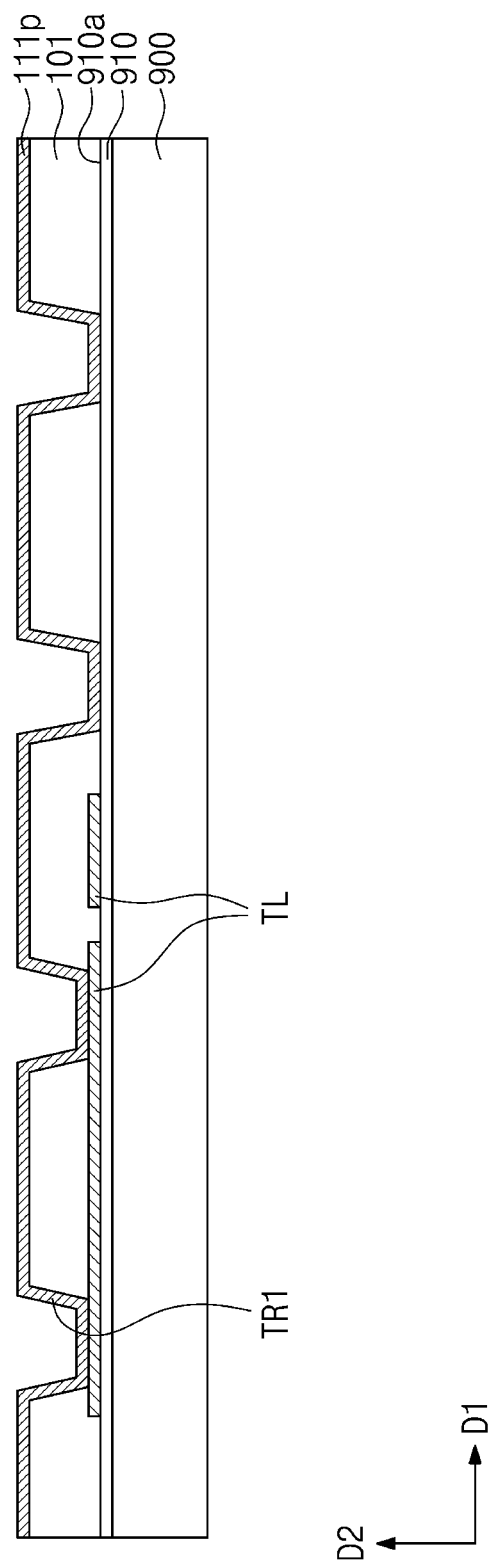

SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2020-0153664, filed on Nov. 17, 2020, in the Korean Intellectual Property Office, the entire contents of which are hereby incorporated by reference.

BACKGROUND OF THE INVENTION

The present disclosure relates to a semiconductor package, and in particular, a semiconductor package including a redistribution substrate and a method of fabricating the same.

A semiconductor package is a structure that is configured to easily use a semiconductor chip as a part of an electronic product. Conventionally, the semiconductor package includes a printed circuit board (PCB) and a semiconductor chip, which is mounted on the PCB and is electrically connected to the PCB using bonding wires or bumps. With development of the electronic industry, many studies are being conducted to improve reliability of the semiconductor package.

SUMMARY

An embodiment of the inventive concept provides a semiconductor package with improved reliability and a method of fabricating the same.

According to an embodiment of the inventive concept, a semiconductor package may be provided.

According to an embodiment of the inventive concept, the semiconductor package may include a redistribution substrate, a semiconductor chip mounted on a top surface of the redistribution substrate, and a conductive terminal provided on a bottom surface of the redistribution substrate. The redistribution substrate may include an under-bump pattern including a via portion in contact with the conductive terminal and a wire portion on the via portion and an insulating layer covering top and side surfaces of the under-bump pattern. A central portion of a bottom surface of the via portion may be provided at a level higher than an edge portion of the bottom surface of the via portion.

According to an embodiment of the inventive concept, the semiconductor package may include a redistribution substrate, a semiconductor chip mounted on a top surface of the redistribution substrate, and a conductive terminal provided on a bottom surface of the redistribution substrate. The redistribution substrate may include an under-bump pattern including a via portion in contact with the conductive terminal and a wire portion on the via portion and redistribution patterns provided on the under-bump pattern. The uppermost redistribution patterns of the redistribution patterns may be connected to the semiconductor chip, and at least one of the uppermost redistribution patterns may include a top surface, on which a recessed portion is formed.

According to an embodiment of the inventive concept, the semiconductor package may include a redistribution substrate, a semiconductor chip mounted on a top surface of the redistribution substrate, a chip connection terminal provided between the redistribution substrate and the semiconductor chip, an under-fill layer surrounding the chip connection terminal, a mold layer covering side and top surfaces of the semiconductor chip and side surfaces of the under-fill layer, and a conductive terminal provided on a bottom surface of the redistribution substrate. The redistribution substrate may include an under-bump pattern including a via portion in contact with the conductive terminal and a wire portion on the via portion, redistribution patterns provided on the under-bump pattern, and an insulating layer covering the under-bump pattern and the redistribution patterns. Each of the redistribution patterns may include a via portion, which is in contact with another one of the redistribution patterns adjacent thereto or the under-bump pattern, and a wire portion, which is provided on the via portion. A central portion of a bottom surface of the via portion of the under-bump pattern may be provided at a level higher than an edge portion of the bottom surface of the via portion of the under-bump pattern.

BRIEF DESCRIPTION OF THE DRAWINGS

The above and other aspects, features, and advantages of the present inventive concept will be more clearly understood from the following detailed description, taken in conjunction with the accompanying drawings, in which like numerals refer to like elements. In the drawings:

FIGS. 4 to 13 and FIGS. 15 to 17 are sectional views illustrating a method of fabricating a semiconductor package, according to an example embodiment of the inventive concept;

DETAILED DESCRIPTION

Figure 1:
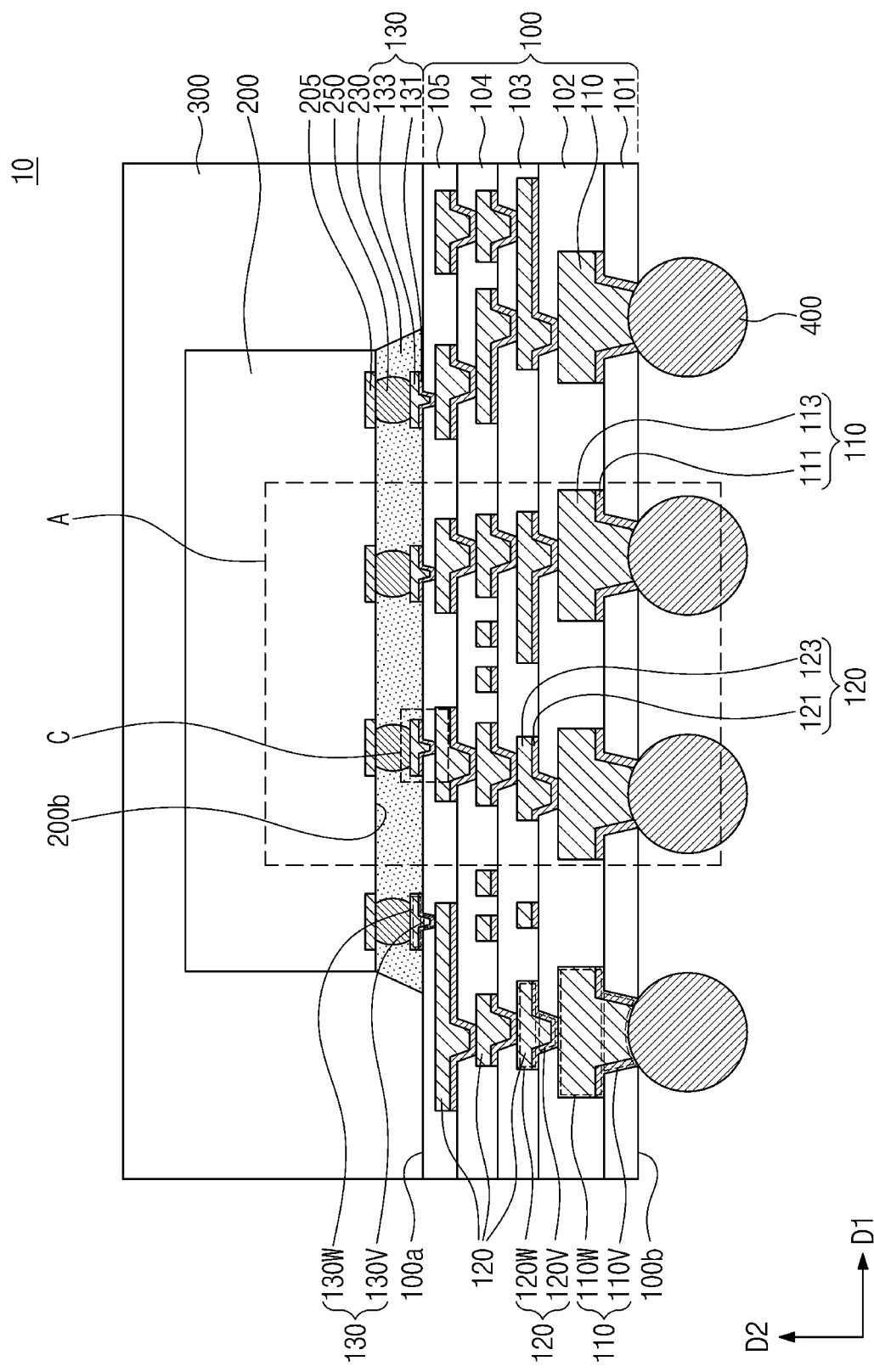
FIG. 1 is a sectional view illustrating a semiconductor package, according to an example embodiment of the inventive concept.

FIG. 1 is a sectional view illustrating a semiconductor package, according to an example embodiment of the inventive concept.

Referring to FIG. 1, a semiconductor package 10 may include a redistribution substrate 100, a first semiconductor chip 200, a mold layer 300, and a plurality of conductive terminals 400. The redistribution substrate 100 may include an under-bump pattern 110, redistribution patterns 120, uppermost redistribution patterns 130, and insulating layers 101, 102, 103, 104, and 105. The insulating layers may include the first to fifth insulating layers 101, 102, 103, 104, and 105, which are sequentially stacked. The redistribution substrate 100 may be referred to as an interconnection structure.

The under-bump pattern 110 may be provided in the first and second insulating layers 101 and 102. A bottom surface 110b of the under-bump pattern 110 may not be covered with the first insulating layer 101. The under-bump pattern 110 may be used as a pad for connection with the conductive terminals 400. The under-bump pattern 110 may include a seed pattern 111 and a conductive pattern 113 on the seed pattern 111. The under-bump pattern 110 may be formed of or may include at least one of metallic materials (e.g., titanium or copper). The under-bump pattern 110 may include a via portion 110V and a wire portion 110W. The under-bump pattern 110 will be described in more detail with reference to FIGS. 2 and 3A.

The first to fifth insulating layers 101, 102, 103, 104, and 105 may be provided on the under-bump pattern 110. The first insulating layer 101 may cover a side surface of the via portion 110V of the under-bump pattern 110. For example, the first insulating layer 101 may contact the side surface of the via portion 110V. The first insulating layer 101 may be the lowermost one of the insulating layers. A bottom surface of the first insulating layer 101 may be a bottom surface 100b of the redistribution substrate 100. The bottom surface 110b of the under-bump pattern 110 may not be covered with the first insulating layer 101. The bottom surface 100b of the first insulating layer 101 may be placed at a level that is substantially equal to or lower than the bottom surface 110b of the under-bump pattern 110. In the present specification, the level may mean a vertical level, and a level difference may be measured in a direction that is perpendicular to the bottom surface 100b of the first insulating layer 101. The first insulating layer 101 may be formed of or may include at least one of organic materials (e.g., photo-sensitive polymer). In the present specification, the photo-sensitive polymer may include at least one of, for example, photo-sensitive polyimide, polybenzoxazole, phenol-based polymer, or benzocyclobutene-based polymer. The first insulating layer 101 may be a positive type photo-sensitive polymer, but the inventive concept is not limited thereto.

The second insulating layer 102 may be disposed on the first insulating layer 101 to cover a top surface of the first insulating layer 101, a top surface of the under-bump pattern 110, and a side surface of the wire portion 110W of the under-bump pattern 110. For example, the second insulating layer 102 may contact the top surface of the first insulating layer 101, the top surface of the under-bump pattern 110, and the side surface of the wire portion 110W of the under-bump pattern 110. In an embodiment, the redistribution pattern 120 may include a via portion 120V and a wire portion 120W, and the second insulating layer 102 may be in contact with side surfaces of the via portions 120V of the redistribution patterns 120, which are in contact with the top surface of the under-bump pattern 110, and in contact with at least a portion of bottom surfaces of the wire portions 120W thereof. The second insulating layer 102 may include, for example, a photo-sensitive polymer. There may be no observable interface between the first and second insulating layers 101 and 102, but the inventive concept is not limited to this example. As used herein, the term "contact" refers to direct contact (i.e., touching) unless the context indicates otherwise. For example, when an element is described as "contacting" or being "in contact with" another element, there are no intervening elements present at the point of contact.

The third insulating layer 103 and the fourth insulating layer 104 may be sequentially provided on the second insulating layer 102. The third insulating layer 103 may cover a top surface of the second insulating layer 102, contacting the top surface of the second insulating layer 102. The fourth insulating layer 104 may cover a top surface of the third insulating layer 103, contacting the top surface of the third insulating layer 103. The fifth insulating layer 105 may cover a top surface of the fourth insulating layer 104, contacting the top surface of the fourth insulating layer 104. A top surface of the fifth insulating layer 105 may be a top surface 100a of the redistribution substrate 100. The first to fifth insulating layers 101, 102, 103, 104, and 105 may be formed of or may include the same material. In this case, there may be no observable interfaces between the first and second insulating layers 101 and 102, between the second and third insulating layers 102 and 103, between the third and fourth insulating layers 103 and 104, or between the fourth and fifth insulating layers 104 and 105, but the inventive concept is not limited to this example. The first to fifth insulating layers 101, 102, 103, 104, and 105 may be provided to have side surfaces which are vertically aligned to each other. A side surface of the first redistribution substrate 100 may be defined by the side surfaces of the first to fifth insulating layers 101, 102, 103, 104, and 105.

The redistribution patterns 120 may be sequentially provided in a second direction D2 from the top surface of the under-bump pattern 110. The redistribution patterns 120 may be provided in the second to fifth insulating layers 102, 103, 104, and 105. The redistribution patterns 120 may be surrounded by the second to fifth insulating layers 102, 103, 104, and 105.

Each of the redistribution patterns 120 may include a seed pattern 121 and a conductive pattern 123, which is provided on the seed pattern 121. The conductive pattern 123 may be provided on the seed pattern 121. The seed pattern 121 may be formed of or may include at least one of copper, titanium, titanium nitride, and/or tantalum nitride. The conductive pattern 123 may be formed of or may include at least one of metallic materials (e.g., copper, titanium, and/or alloys thereof).

As described above, each of the redistribution patterns 120 may include the via portion 120V and the wire portion 120W. The wire portion 120W may be provided on and connected to the via portion 120V. The wire portion 120W may have a width and a length which are larger than those of the via portion 120V. The wire portion 120W may be extended in a first direction D1 and may have a longitudinal axis parallel to the first direction D1. The wire portion 120W may be a portion of the redistribution pattern 120, which is extended in the first direction D1, and the via portion 120V may be a protruding portion, which is extended from the wire portion 120W toward the bottom surface 100b of the redistribution substrate 100. The redistribution patterns 120 may be provided such that the via portions 120V thereof face the bottom surface 100b of the redistribution substrate 100. The via portion 120V may have a tapered shape that narrows in a direction toward the bottom surface 100b of the redistribution substrate 100. The via portion 120V of each of the redistribution patterns 120 may be provided to be in contact with the top surface of one of the under-bump patterns 110 or with the wire portion 120W of another one of the redistribution patterns 120. The wire portion 120W of each of the redistribution patterns 120 may be in contact with the via portion 120V of another one of the redistribution patterns 120 or with a via portion 130V of a corresponding one of the uppermost redistribution patterns 130.

For example, the via portions 120V of the redistribution patterns 120, which are most adjacent to the under-bump patterns 110, may be respectively provided to be in contact with top surfaces of the under-bump patterns 110. The conductive patterns 123 of the redistribution patterns 120 may not be in direct contact with the under-bump patterns 110. The seed patterns 121 may be respectively interposed between the conductive patterns 123 of the redistribution patterns 120 and the top surfaces of the under-bump patterns 110. The seed patterns 121 may be in direct contact with the top surfaces of the under-bump patterns 110. Alternatively, the via portions 120V of some of the redistribution patterns 120 may be respectively provided to be in contact with the top surfaces of the redistribution patterns 120 adjacent thereto.

Each of the via and wire portions 120V and 120W of the redistribution patterns 120 may include the seed pattern 121 and the conductive pattern 123. The seed pattern 121 of the via portion 120V may be directly connected to the seed pattern 121 of the wire portion 120W without any interface therebetween. In example embodiments, the seed pattern 121 of the via portion 120V and the seed pattern 121 of the wire portion 120W may be in material continuity with one another. For example, the seed pattern 121 of the via portion 120V and the seed pattern 121 of the wire portion 120W may be a homogeneous monolithic structure. The seed pattern 121 may be provided on a bottom surface of the conductive pattern 123 of the via portion 120V and may be interposed between a side surface of the conductive pattern 123 of the via portion 120V and a corresponding adjacent one of the insulating layers 102, 103, 104, or 105 and between a bottom surface of the conductive pattern 123 of the wire portion 120W and a corresponding adjacent one of the insulating layers 102, 103, 104, or 105. The seed pattern 121 may not be extended onto side and top surfaces of the conductive pattern 123 of the wire portion 120W. The conductive pattern 123 of the via portion 120V may be directly connected to the conductive pattern 123 of the wire portion 120W. In example embodiments, the conductive pattern 123 of the via portion 120V and the conductive pattern 123 of the wire portion 120W may be in material continuity with one another. For example, the conductive pattern 123 of the via portion 120V and the conductive pattern 123 of the wire portion 120W may be a homogeneous monolithic structure.

The uppermost redistribution patterns 130 may be respectively provided on the redistribution patterns 120 adjacent thereto. The uppermost redistribution patterns 130 may be used as pads for connection with chip connection terminals 250. Each of the uppermost redistribution patterns 130 may include a seed pattern 131 and a conductive pattern 133, which is disposed on the seed pattern 131. Each of the uppermost redistribution patterns 130 may include the via portion 130V, which is connected to a corresponding adjacent one of the redistribution patterns 120, and a pad portion 130W, which is provided on the via portion 130V. Thus, when viewed in a sectional view, each of the uppermost redistribution patterns 130 may be a 'T'-shaped pattern. The fifth insulating layer 105 may be provided to expose the pad portion 130W. The uppermost redistribution patterns 130 may define positions of the chip connection terminals 250. The uppermost redistribution pattern 130 may be coupled to the redistribution pattern 120 adjacent thereto. More specifically, the uppermost redistribution pattern 130 may be in contact with the conductive pattern 123 of the redistribution pattern 120 adjacent thereto. The uppermost redistribution patterns 130 may be formed of or may include at least one of conductive materials. For example, the uppermost redistribution patterns 130 may be formed of or may include at least one of metallic materials (e.g., copper, titanium, aluminum, tungsten, and/or alloys thereof). The stacking number of the first to fifth insulating layers 101, 102, 103, 104, and 105 and the number of the redistribution patterns 120 are not limited to those in the illustrated examples and may be variously changed. For example, there may be greater or fewer of the first to fifth insulating layers 101, 102, 103, 104, and 105 and the redistribution patterns 120 than that illustrated.

Figure 2:
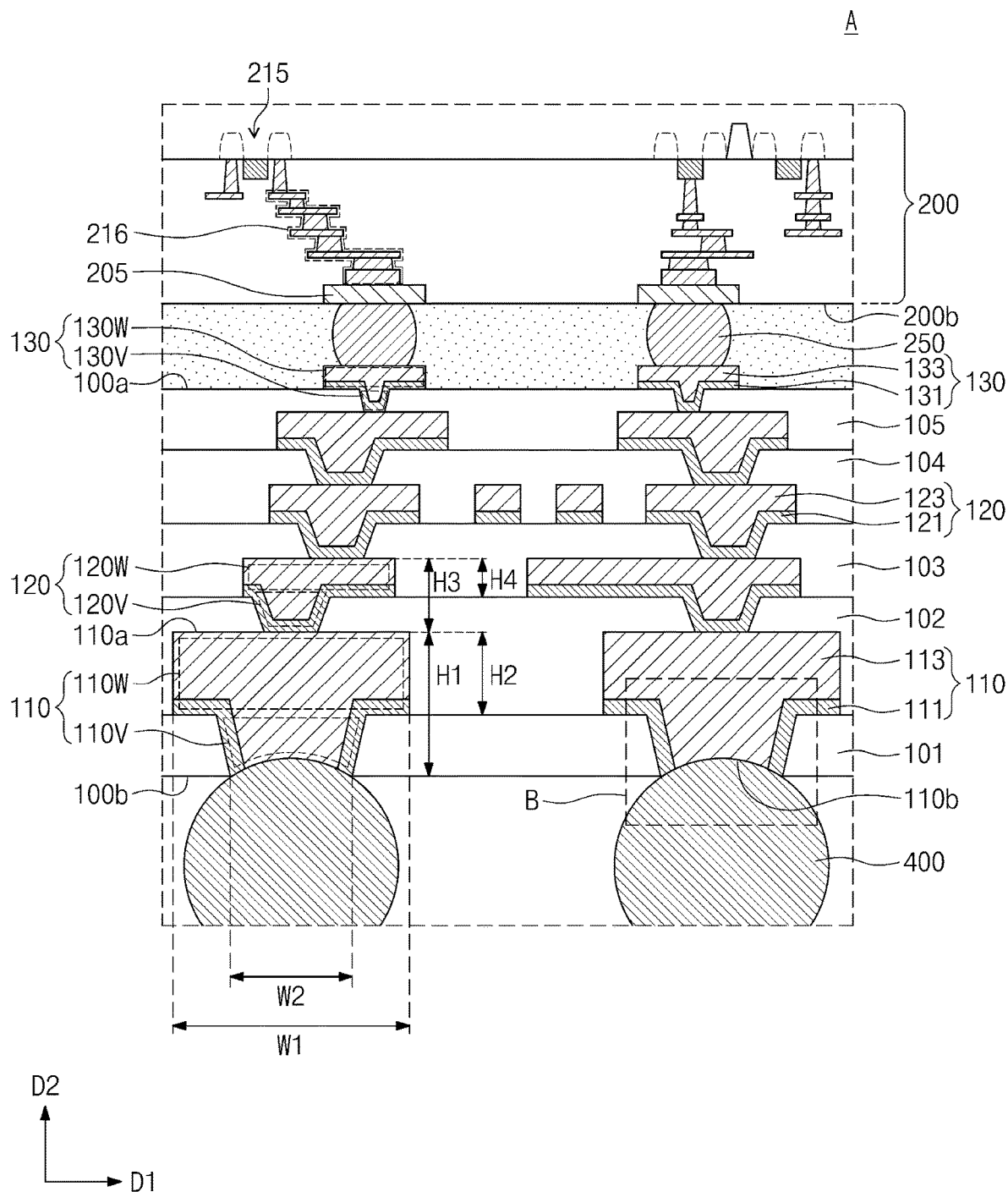
FIG. 2 is an enlarged sectional view of a portion A of FIG. 1.

The first semiconductor chip 200 may be mounted on the top surface 100a of the redistribution substrate 100. The first semiconductor chip 200 may include first chip pads 205, integrated circuits 215, and a connection structure 216, as shown in FIG. 2. The first semiconductor chip 200 may be disposed on a center region of the redistribution substrate 100. The first chip pads 205 may be formed of or may include at least one of metal materials (e.g., copper, tungsten, titanium, and/or alloys thereof). The first chip pads 205 may be exposed to the outside of the first semiconductor chip 200, near a bottom surface 200b of the first semiconductor chip 200. The first chip pads 205 may connect the first semiconductor chip 200 to the redistribution substrate 100. The integrated circuits 215 may be provided in the first semiconductor chip 200. The integrated circuits 215 may be disposed adjacent to a bottom surface 200b of the first semiconductor chip 200. The integrated circuits 215 may include a memory circuit, a logic circuit, and/or combinations thereof. The connection structure 216 may be interposed between the integrated circuits 215 and the first chip pads 205. The connection structure 216 may include internal metal lines and metal vias. The first chip pads 205 may be electrically connected to the integrated circuits 215 through the connection structure 216. The expression "an element is coupled or connected to the first chip pads 205" may mean that the element is coupled or connected to the first semiconductor chip 200. In addition, the expression "an element is coupled or connected to first semiconductor chip 200" may mean that the element is coupled or connected to the integrated circuits 215 of the first semiconductor chip 200. Hereinafter, the integrated circuits 215 and the connection structure 216 will be omitted in all drawings except for FIG. 2, for brevity's sake.

The chip connection terminals 250 may be respectively interposed between the first chip pads 205 and the uppermost redistribution patterns 130. The chip connection terminals 250 may include at least one of a solder ball, a solder pillar, or a solder bump. The chip connection terminals 250 may be formed of or may include at least one of conductive materials (e.g., solder materials). The solder materials may include, for example, tin, bismuth, lead, silver, or alloys thereof. The first semiconductor chip 200 may be electrically connected to the redistribution substrate 100 through the chip connection terminals 250. Hereinafter, the expression "an element A is electrically connected to an element B" may be used in the context that the element A is connected to the element B in a physical, electrical, direct, or indirect manner.

A first under-fill layer 230 may be provided between the redistribution substrate 100 and the first semiconductor chip 200. More specifically, the first under-fill layer 230 may fill a gap region between the redistribution substrate 100 and the first semiconductor chip 200 and may seal chip connection terminals 250 in the gap region. The first under-fill layer 230 may be formed of or may include at least one of insulating polymers (e.g., epoxy-based polymers). In an embodiment, the first under-fill layer 230 may be omitted, unlike the illustrated structure.

The mold layer 300 may be disposed on the top surface 100a of the redistribution substrate 100 to cover side and top surfaces of the first semiconductor chip 200. The mold layer 300 may cover the uppermost insulating layer of the insulating layers 101, 102, 103, 104, and 105. The uppermost insulating layer may be the fifth insulating layer 105. The mold layer 300 may be formed of or may include at least one of, for example, insulating polymers (e.g., epoxy molding compounds). In the case where the first under-fill layer 230 is omitted, the mold layer 300 may be extended into the gap region between the first semiconductor chip 200 and the redistribution substrate 100 to seal the chip connection terminals 250.

FIG. 2 is an enlarged sectional view of a portion A of FIG. 1. Hereinafter, a single under-bump pattern will be described in more detail below, and an overlapping description of previously described elements will be minimized.

The under-bump pattern 110 may include the seed pattern 111 and the conductive pattern 113 on the seed pattern 111. The seed pattern 111 may be formed of or may include at least one of copper, titanium, titanium nitride, and/or tantalum nitride. The conductive pattern 113 may be formed of or may include at least one of metallic materials (e.g., copper, titanium, and/or alloys thereof).

The under-bump pattern 110 may include the via portion 110V and the wire portion 110W. The wire portion 110W may be provided on the via portion 110V and may be connected to the via portion 110V. The wire portion 110W may have a width or a length which are larger than those of the via portion 110V. The wire portion 110W may be extended in the first direction D1 and may have a longitudinal axis parallel to the first direction D1. The wire portion 110W may be a portion of the under-bump pattern 110, which is extended parallel to the first direction D1, and the via portion 110V may be a protruding portion, which is extended from the wire portion 110W toward the bottom surface 100b of the redistribution substrate 100. The via portion 110V may have a tapered shape that narrows in a direction toward the bottom surface 100b of the redistribution substrate 100. The via portion 110V of the under-bump pattern 110 may be in contact with the conductive terminal 400. The wire portion 110W of the under-bump pattern 110 may be in contact with the via portion 120V of a neighboring one of the redistribution patterns 120. A top surface 110a of the under-bump pattern 110 may be defined as a top surface of the wire portion 110W, and the bottom surface 110b of the under-bump pattern 110 may be defined as a bottom surface of the via portion 110V.

Each of the via and wire portions 110V and 110W of the under-bump pattern 110 may include the seed pattern 111 and the conductive pattern 113. The seed pattern 111 of the via portion 110V may be directly connected to the seed pattern 111 of the wire portion 110W without any interface therebetween. In example embodiments, the seed pattern 111 of the via portion 110V and the seed pattern 111 of the wire portion 110W may be in material continuity with one another. For example, the seed pattern 111 of the via portion 110V and the seed pattern 111 of the wire portion 110W may be a homogeneous monolithic structure. The seed pattern 111 may be interposed between the side surface of the conductive pattern 123 of the via portion 120V and a corresponding adjacent one of the insulating layers and between the bottom surface of the conductive pattern 123 of the wire portion 120W and a corresponding adjacent one of the insulating layers. The seed pattern 111 may not be provided on a bottom surface of the conductive pattern 113 of the via portion 110V. Accordingly, the conductive pattern 113 of the via portion 110V of the under-bump pattern 110 may be in direct and physical contact with the conductive terminal 400. The seed pattern 111 may not be extended onto side and top surfaces of the conductive pattern 113 of the wire portion 110W. The conductive pattern 113 of the via portion 110V may be directly connected to the conductive pattern 113 of the wire portion 110W. In example embodiments, the conductive pattern 113 of the via portion 110V and the conductive pattern 113 of the wire portion 110W may be in material continuity with one another. For example, the conductive pattern 113 of the via portion 110V and the conductive pattern 113 of the wire portion 110W may be a homogeneous monolithic structure.

The under-bump pattern 110 may have a height H1 ranging from 15 µm to 25 µm. The height H1 of the under-bump pattern 110 may be the vertical distance from the bottom surface 100b of the redistribution substrate 100 to the top surface 110a of the under-bump pattern 110. The wire portion 110W of the under-bump pattern 110 may have a height H2 ranging from 7 µm to 13 µm. The height H2 of the wire portion 110W of the under-bump pattern 110 may be a vertical distance from the top surface of the first insulating layer 101 to the top surface 110a of the wire portion 110W. The largest width W1 of the under-bump pattern 110 may be smaller than or equal to 100 µm and, in an embodiment, it may be within a range of 50 µm to 100 µm. The largest width W1 of the under-bump pattern 110 may be a width of the wire portion 110W of the under-bump pattern 110. The smallest width W2 of the under-bump pattern 110 may be smaller than or equal to 75 µm, and in an embodiment, it may be within a range of 35 µm to 75 µm. The smallest width W2 of the under-bump pattern 110 may be a width of the lowermost portion of the via portion 110V of the under-bump pattern 110. A ratio of the width W2 to the width W1 may be within a range of 0.7 to 0.8. The ratio of the width W2 to the width W1 may be defined as a ratio of a width of the via portion 110V to a width of the wire portion 110W of the under-bump pattern 110.

One of the redistribution patterns 120 may have a height H3 ranging from 1 µm to 5 µm. The height H3 may be a vertical distance from the top surface of the wire portion 120W of the one of the redistribution patterns 120 to the bottom surface of the via portion 120V. The wire portion 120W of the redistribution patterns 120 may have a height H4 ranging from 1 µm to 3 µm. The height H4 may be a vertical distance from the top surface of the second insulating layer 102 to the top surface of the wire portion 120W.

The height H1 of the under-bump pattern 110 may have a relatively large value, as shown in FIG. 2. For example, a ratio of the height H3 of the redistribution pattern 120 to the height H1 of the under-bump pattern 110 may be within a range of 0.1 to 0.2. In an embodiment, since the under-bump pattern 110 has a relatively large height, connection characteristics between the conductive terminals 400 and the redistribution patterns 120 may be improved. For example, in the case where the conductive terminals 400 are formed on the bottom surface of the under-bump pattern 110, the under-bump patterns 110 adjacent to the conductive terminals 400 may be shrunken by a thermal treatment process for bonding of the conductive terminals 400. Thus, the under-bump pattern 110 may be separated from the redistribution pattern 120 to cause a contact failure. However, in the case where the height of the under-bump pattern 110 has a sufficiently large value as described above, the shrink ratio of the under-bump pattern 110 may be lowered during the thermal treatment process. Accordingly, it may be possible to improve contact characteristics between the redistribution pattern 120 and the conductive terminals 400 and thereby to improve reliability of the redistribution substrate 100.

Figure 3A:
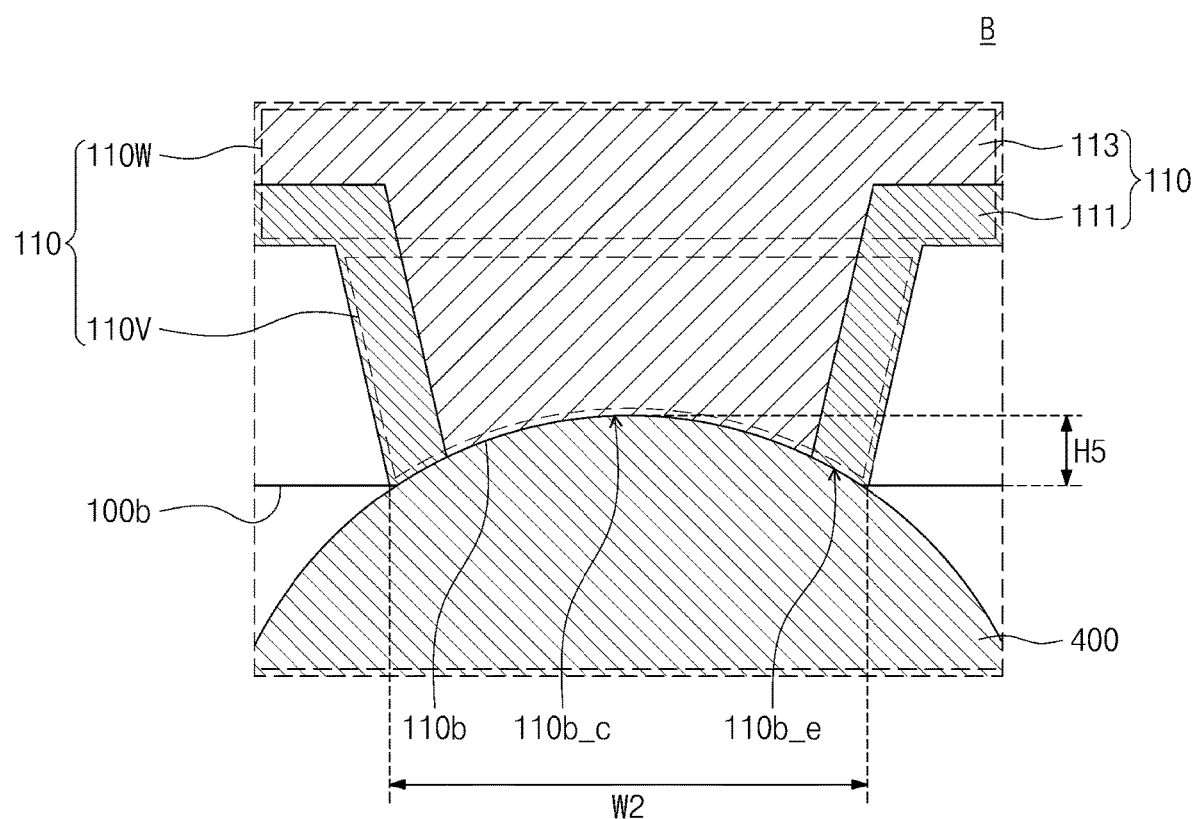
FIG. 3A is an enlarged sectional view of a portion B of FIG. 2.

FIG. 3A is an enlarged sectional view of a portion B of FIG. 2. For concise description, previously described elements may be identified by the same reference numbers without repeating an overlapping description thereof.

Referring to FIG. 3A, the bottom surface 110b of the under-bump pattern 110 may have a shape that is curvedly recessed toward the wire portion 110W of the under-bump pattern 110. More specifically, the bottom surface 110b of the via portion 110V of the under-bump pattern 110 may be a curved surface that is concavely recessed in a direction toward the wire portion 110W. Thus, a central portion 110b_c of the bottom surface 110b of the via portion 110V may be closer to the wire portion 110W of the under-bump pattern 110 than an edge portion 110b_e of the bottom surface 110b of the via portion 110V. The central portion 110b_c of the bottom surface 110b of the via portion 110V may be located at a level higher than the edge portion 110b_e of the bottom surface 110b of the via portion 110V and the bottom surface 100b of the redistribution substrate 100. For example, a vertical distance H5 from the bottom surface 100b of the redistribution substrate 100 to the central portion 110b_c of the bottom surface 110b of the via portion 110V may be within a range of 500 nm to 1 µm. A ratio of the distance H5 to the width W2 of the via portion 110V may be within a range of 0.01 to 0.2.

The conductive terminal 400 may be provided on the bottom surface 110b of the under-bump pattern 110. More specifically, each of the seed and conductive patterns 111 and 113 of the via portion 110V of the under-bump pattern 110 may be in direct and physical contact with the conductive terminal 400. The under-bump pattern 110 may be in contact with the conductive terminal 400 through the bottom surface 110b. Since the bottom surface 100b of the under-bump pattern 110 has a curved surface, an interface between the conductive terminal 400 and the via portion 110V may be a curved surface that is convexly recessed in a direction toward the wire portion 110W. Accordingly, the topmost portion of the conductive terminal 400 may be located at a level higher than the bottom surface 100b of the redistribution substrate 100.

According to an embodiment of the inventive concept, since the bottom surface 110b of the under-bump pattern 110 has the curved shape, the conductive terminal 400 may be more effectively aligned to the bottom surface 110b of the under-bump pattern 110 during forming the conductive terminal 400.

Figure 3B:
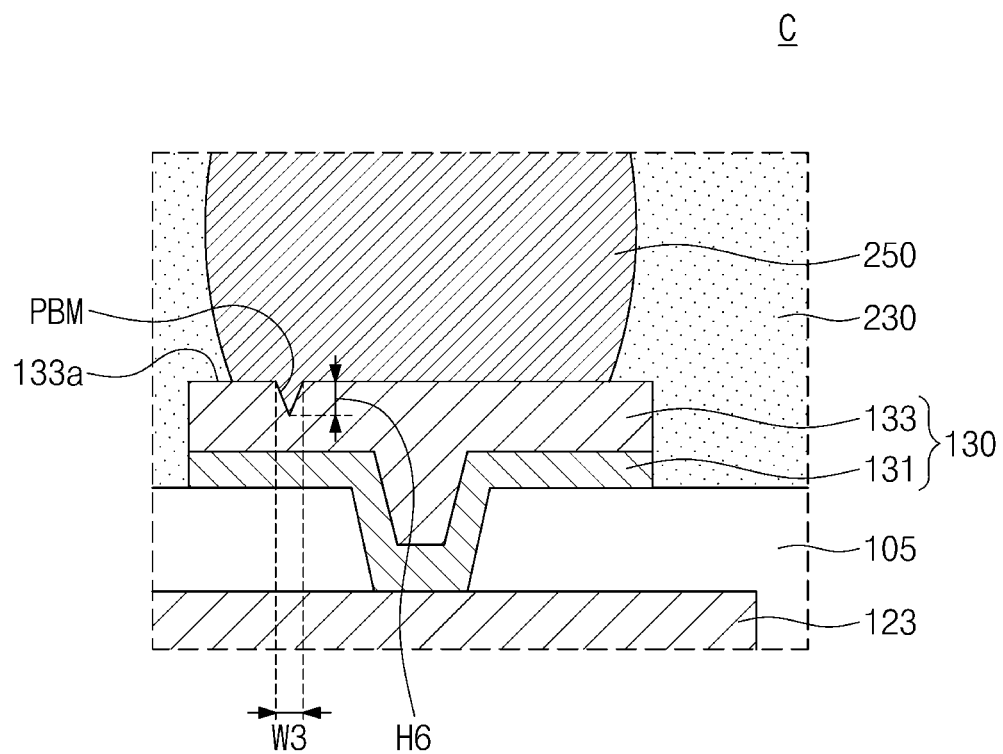
FIG. 3B is an enlarged sectional view of a portion C of FIG. 1.

FIG. 3B is an enlarged sectional view of a portion C of FIG. 1. For concise description, previously described elements may be identified by the same reference numbers without repeating an overlapping description thereof.

Referring to FIG. 3B, at least one of the uppermost redistribution patterns 130 may have a top surface 133a, on which a recessed portion PBM is formed. More specifically, the top surfaces 133a of the uppermost redistribution patterns 130 may be the top surfaces 133a of the conductive patterns 133 of the uppermost redistribution patterns 130. The largest width W3 of the recessed portion PBM may be within a range of 200 nm to 300 nm. The recessed portion PBM may have a depth H6 ranging from 500 nm to 1 µm. The depth H6 of the recessed portion PBM may be a vertical distance from the top surface 133a of the at least one of the redistribution patterns 130 to the lowermost portion of the recessed portion PBM. As an example, the recessed portion PBM may have a circular or elliptical shape, when viewed in a plan view, but the shape of the recessed portion PBM is not limited thereto and is variously changed. The chip connection terminal 250 may be provided on the top surface 133a of the uppermost redistribution patterns 130. The chip connection terminal 250 may be extended into the recessed portion PBM.

FIGS. 4 to 13 and FIGS. 15 to 17 are sectional views illustrating a method of fabricating a semiconductor package, according to an example embodiment of the inventive concept. FIG. 14 is an enlarged sectional view of a portion D of FIG. 13. For concise description, previously described elements may be identified by the same reference numbers without repeating an overlapping description thereof.

Referring to FIG. 4, a test line TL may be formed on a carrier substrate 900. A release layer 910 may be provided on the carrier substrate 900 to be interposed between the carrier substrate 900 and the test line TL. The release layer 910 may attach the test line TL to the carrier substrate 900.

The formation of the test line TL may include forming a resist pattern with an opening on a top surface 910a of the release layer 910, depositing a metal material to form a preliminary test seed layer, and performing an electroplating process, in which the preliminary test seed layer is used as an electrode, to form the test line TL. In an embodiment, a plurality of the test lines TL may be formed.

Figure 6:
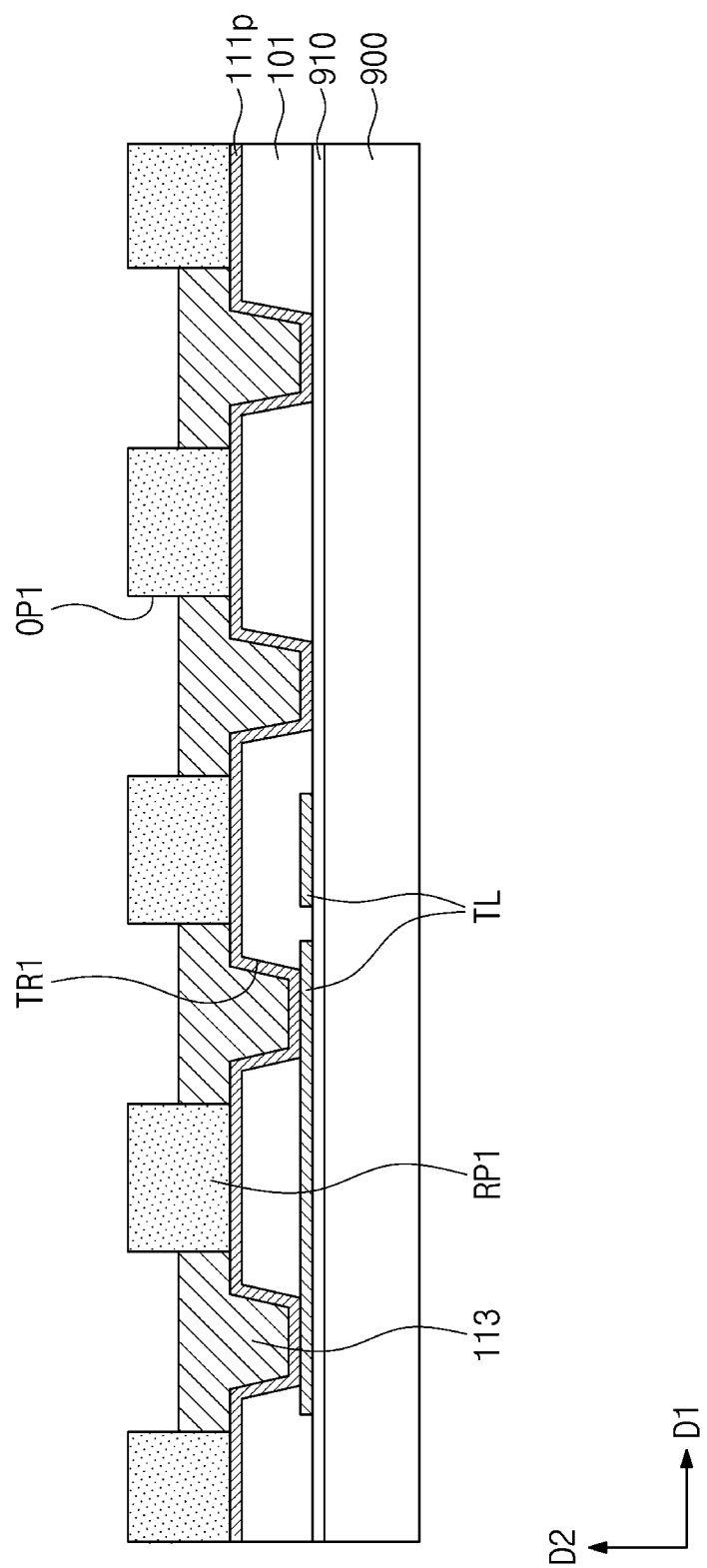
Figure 7:
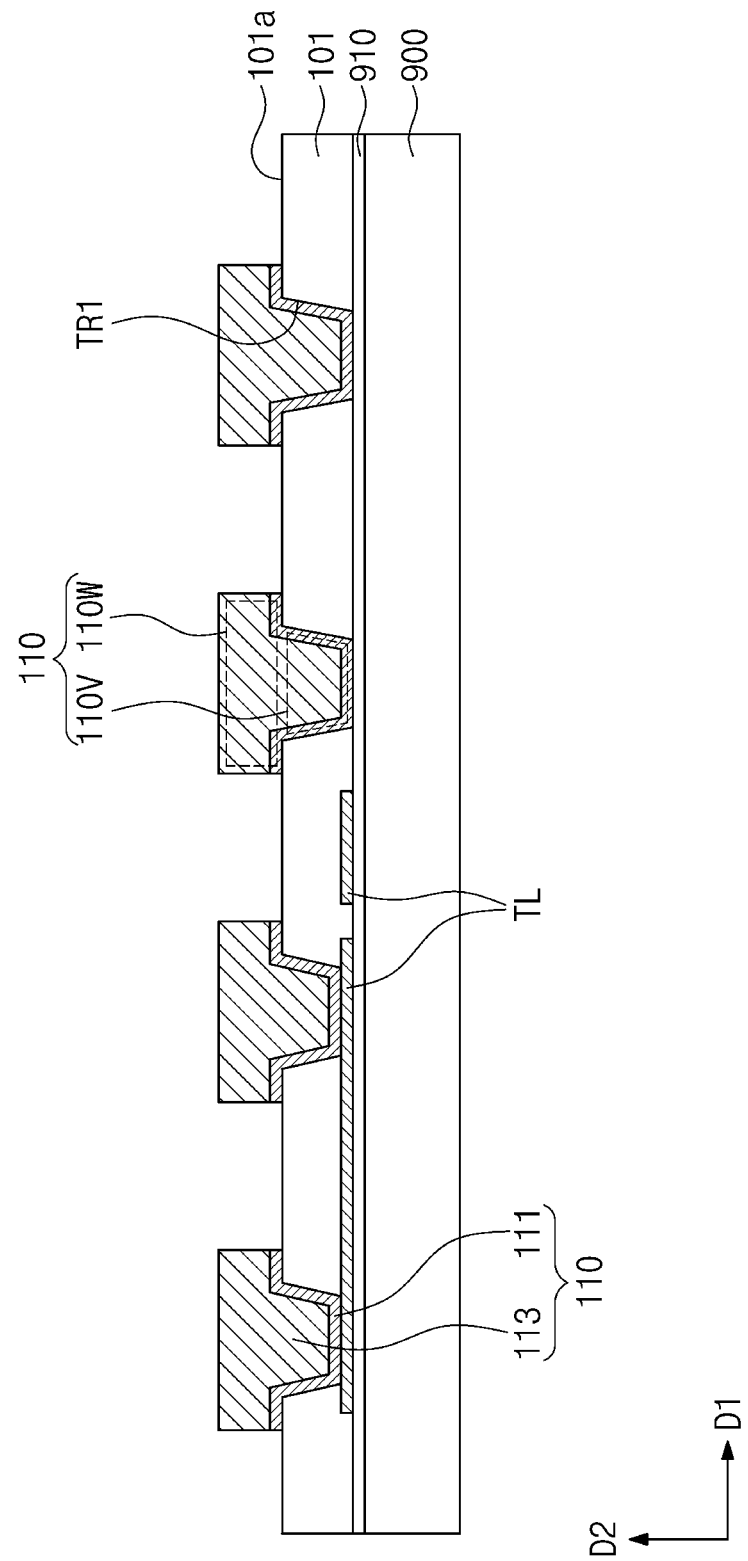
Figure 8:
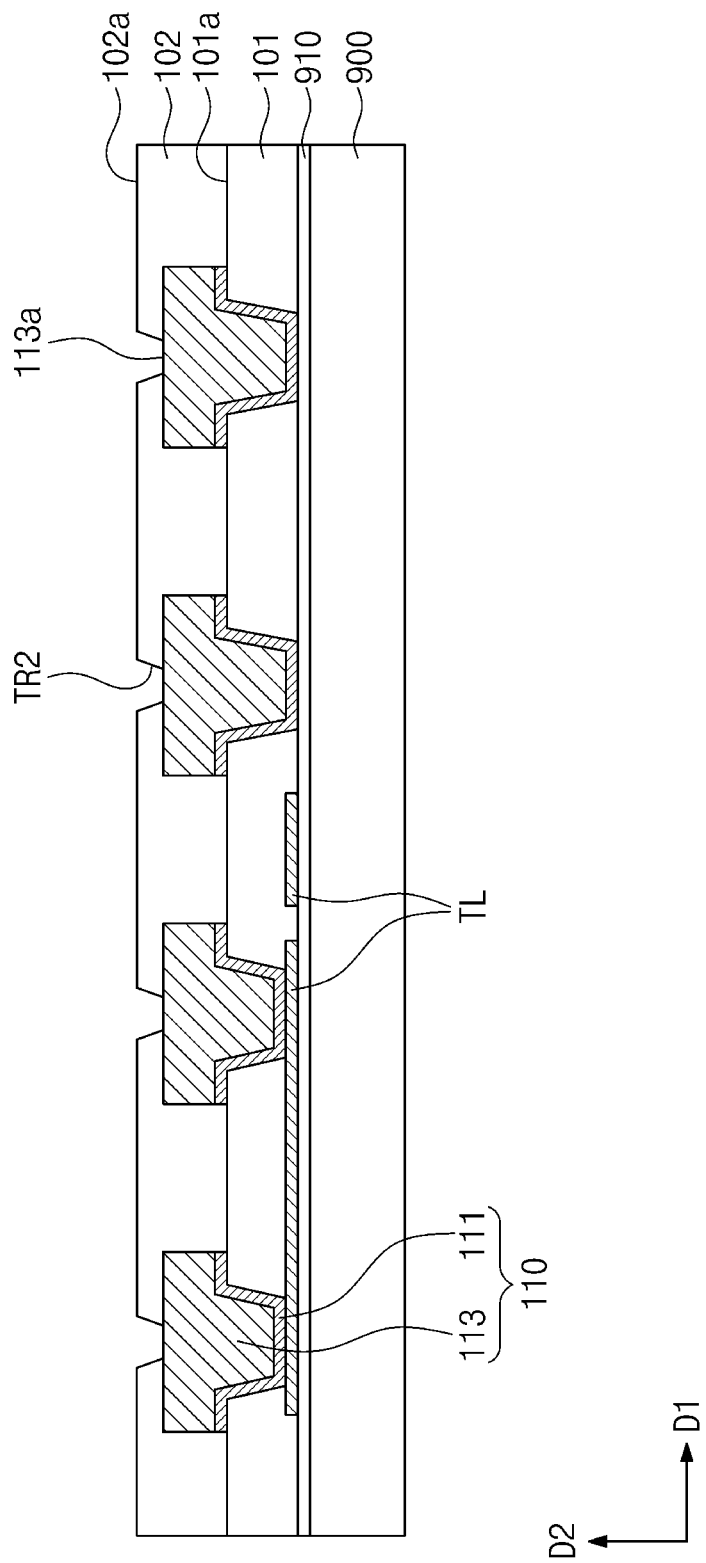

Referring to FIGS. 5 to 7, the under-bump patterns 110 may be formed on the test line TL and the top surface 910a of the release layer 910. The formation of the under-bump patterns 110 may include forming the first insulating layer 101 having first trenches TR1 and forming a first seed layer 111p, a first resist pattern RP1, and the conductive pattern 113 on the top surface of the first insulating layer 101.

Referring to FIG. 5, the first insulating layer 101 may be formed to cover the test line TL and the top surface 910a of the release layer 910. The first insulating layer 101 may be formed using a coating process (e.g., a spin coating process or a slit coating process). The first trenches TR1 may be formed in the first insulating layer 101 by patterning the first insulating layer 101. The patterning of the first insulating layer 101 may be performed through exposing and developing processes. The first trenches TR1 may be formed to expose the top surfaces of the test lines TL and the top surface 910a of the release layer 910.

The first seed layer 111p may be formed on the top surface of the first insulating layer 101 and in the first trenches TR1. More specifically, the first seed layer 111p may conformally cover the top surface of the first insulating layer 101, inner side surfaces of the first trenches TR1, the exposed top surfaces of the test lines TL, and the exposed top surface 910a of the release layer 910.

Referring to FIG. 6, the first resist pattern RP1 may be formed on the first seed layer 111p. The formation of the first resist pattern RP1 may include coating a photoresist material on the first seed layer 111p and patterning the photoresist material to form the first resist pattern RP1 with first openings OP1. The patterning of the photoresist material may be performed using exposing and developing processes. The first openings OP1 may vertically overlap with the first trenches TR1, respectively. The first openings OP1 may have widths that are larger than widths of corresponding ones of the first trenches TR1. In an embodiment, the first openings OP1 may be formed to have lengths that are larger than lengths of corresponding ones of the first trenches TR1. A side surface of each of the first openings OP1 may be substantially perpendicular to its bottom surface. Each of the first openings OP1 may be formed to expose the first seed layer 111p.

The conductive patterns 113 may be formed in the first trenches TR1, respectively, to cover the first seed layer 111p. Also, the conductive patterns 113 may be formed to fill lower portions of the first openings OP1, respectively. For example, the conductive patterns 113 may fill the first trenches TR1 but may not be extended to a region on the top surface of the first resist pattern RP1. The conductive patterns 113 may be formed by an electroplating process using the first seed layer 111p as an electrode. In an embodiment, a planarization process may not be performed to form the conductive patterns 113.

Referring to FIG. 7, the first resist pattern RP1 may be removed to expose the top surface of the first seed layer 111p. The removal of the first resist pattern RP1 may be performed using a strip process. Next, the seed patterns 111 may be formed by removing exposed portions of the first seed layer 111p. In an embodiment, the exposed portions of the first seed layer 111p may be removed by an etching process. The etching process may be a wet etching process. In the etching process, the conductive patterns 113 may have etch selectivity with respect to the first seed layer 111p. The seed patterns 111 may not be exposed to the etching process, due to the conductive patterns 113 thereon. The portions of the first seed layer 111p, which are left after the etching process, may form the seed patterns 111. As a result, the under-bump patterns 110 may be formed. The under-bump patterns 110 may be spaced apart from each other in a horizontal direction. Each of the under-bump patterns 110 may include the seed pattern 111 and the conductive pattern 113. The conductive patterns 113 may be disposed on the seed patterns 111, respectively. Each of the under-bump patterns 110 may include the via portion 110V and the wire portion 110W. Each of the via portions 110V may be provided in a corresponding one of the first trenches TR1. The wire portion 110W may be provided on the top surface of the first insulating layer 101 and the via portion 110V. The via and wire portions 110V and 110W may be the same as those in the embodiment described with reference to FIGS. 1, 2, 3A, and 3B.

Referring to FIGS. 8 to 11, the redistribution patterns 120 may be formed on the under-bump patterns 110. The formation of the redistribution patterns 120 may include sequentially forming a second insulating layer 102 and a second seed layer 121p on the under-bump patterns 110, forming second resist patterns RP2, in which second openings OP2 are defined, on the second seed layer 121p, forming the conductive patterns 123 in the second openings OP2, removing the second resist patterns RP2 to expose portions of the second seed layer 121p, and etching the exposed portions of the second seed layer 121p to form the seed patterns 121.

More specifically, the second insulating layer 102 may be formed on the first insulating layer 101 to cover the first insulating layer 101 and the under-bump patterns 110. For example, the second insulating layer 102 may cover the top and side surfaces of the under-bump patterns 110. In an embodiment, the second insulating layer 102 may be formed by a coating process.

In an embodiment, the second insulating layer 102 may be patterned to have the second trenches TR2 defined in the second insulating layer 102. The second trenches TR2 may be formed to expose top surfaces 113a of the under-bump patterns 110. For example, each of the second trenches TR2 may be formed to expose the top surface 113a of the wire portion 110W corresponding thereto.

Figure 9:
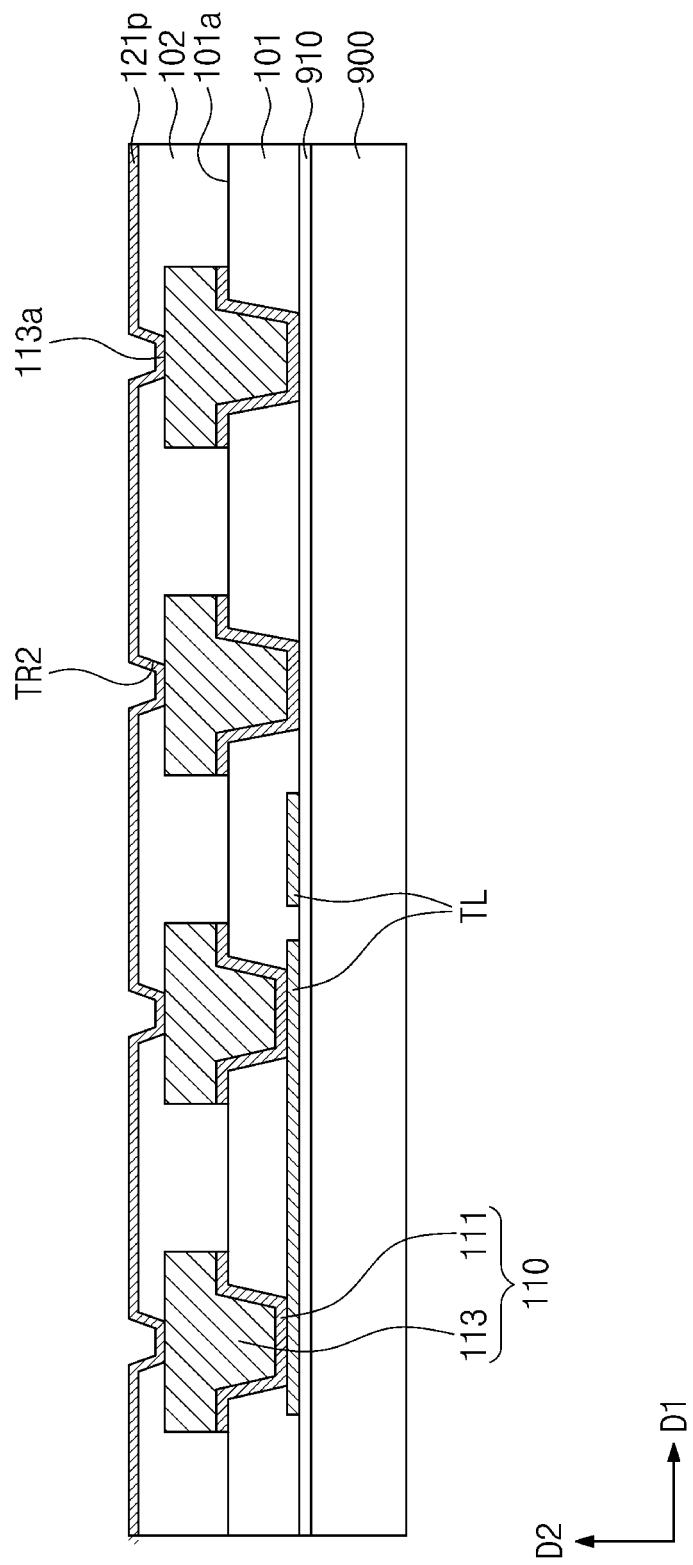

Referring to FIG. 9, the second seed layer 121p may be formed on the second insulating layer 102 and the exposed top surfaces 113a of the under-bump patterns 110. The second seed layer 121p may be formed by the same method as the first seed layer 111p.

Figure 10:
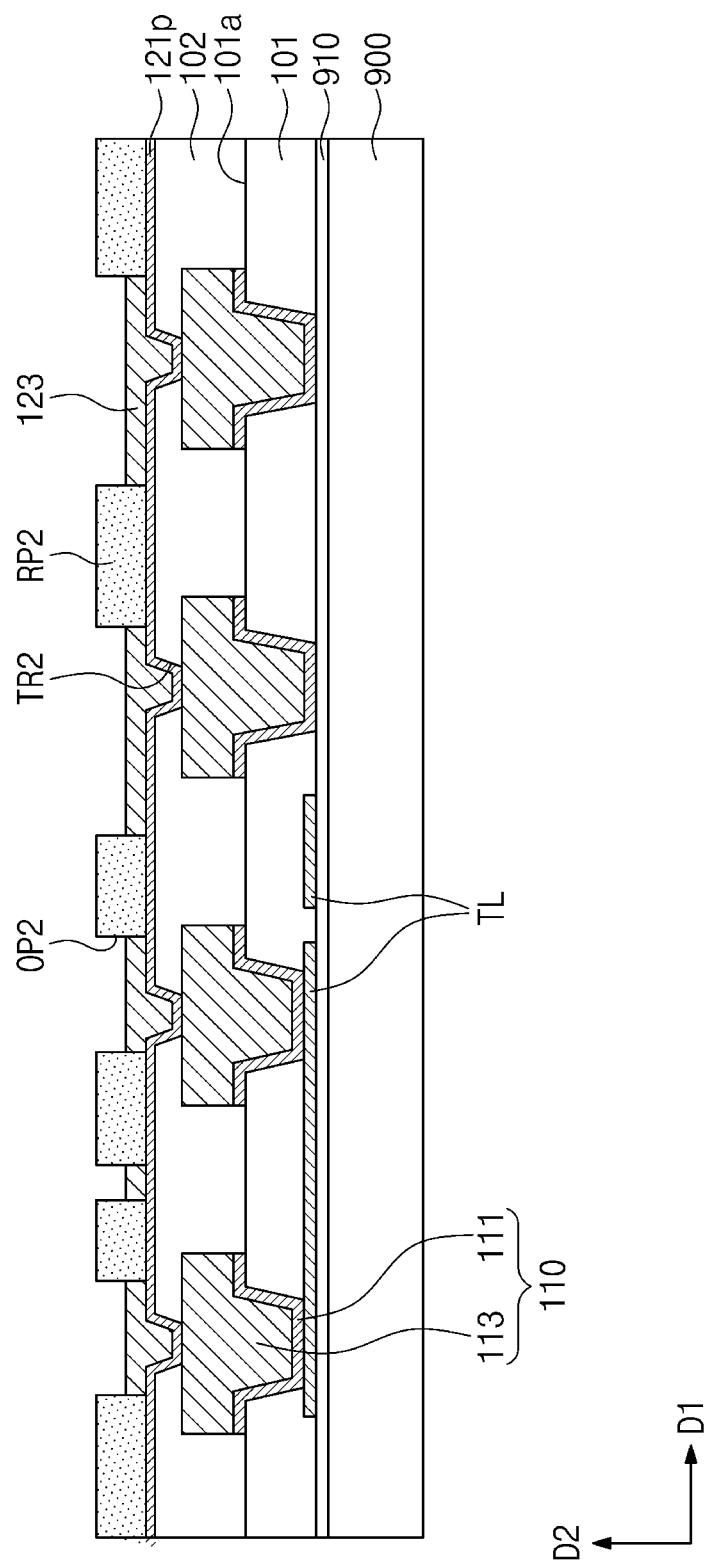

Referring to FIG. 10, the second resist pattern RP2 with the second openings OP2 may be formed on the second seed layer 121p. The second resist pattern RP2 may be formed by the same method as the first resist pattern RP1 described with reference to FIG. 6. For example, the formation of the second resist pattern RP2 may include coating a photoresist material on the second seed layer 121p and patterning the photoresist material to form the second resist pattern RP2 with second openings OP2. The second openings OP2 may vertically overlap with the second trenches TR2, respectively. The second openings OP2 may have widths that are larger than widths of corresponding ones of the second trenches TR2. In an embodiment, the second openings OP2 may be formed to have lengths that are larger than lengths of corresponding ones of the second trenches TR2. A side surface of each of the second openings OP2 may be substantially perpendicular to its bottom surface. Each of the second openings OP2 may be formed to expose the second seed layer 121p.

The conductive patterns 123 may be formed in the second trenches TR2, respectively, to cover the second seed layer 121p. Also, the conductive patterns 123 may be formed to fill lower portions of the second openings OP2, respectively. For example, the conductive patterns 123 may fill the second trenches TR2 but may not be extended to a region on the top surface of the second resist pattern RP2. The conductive patterns 123 may be formed by an electroplating process using the second seed layer 121p as an electrode. In an embodiment, a planarization process may not be performed to form the conductive patterns 123.

Figure 11:
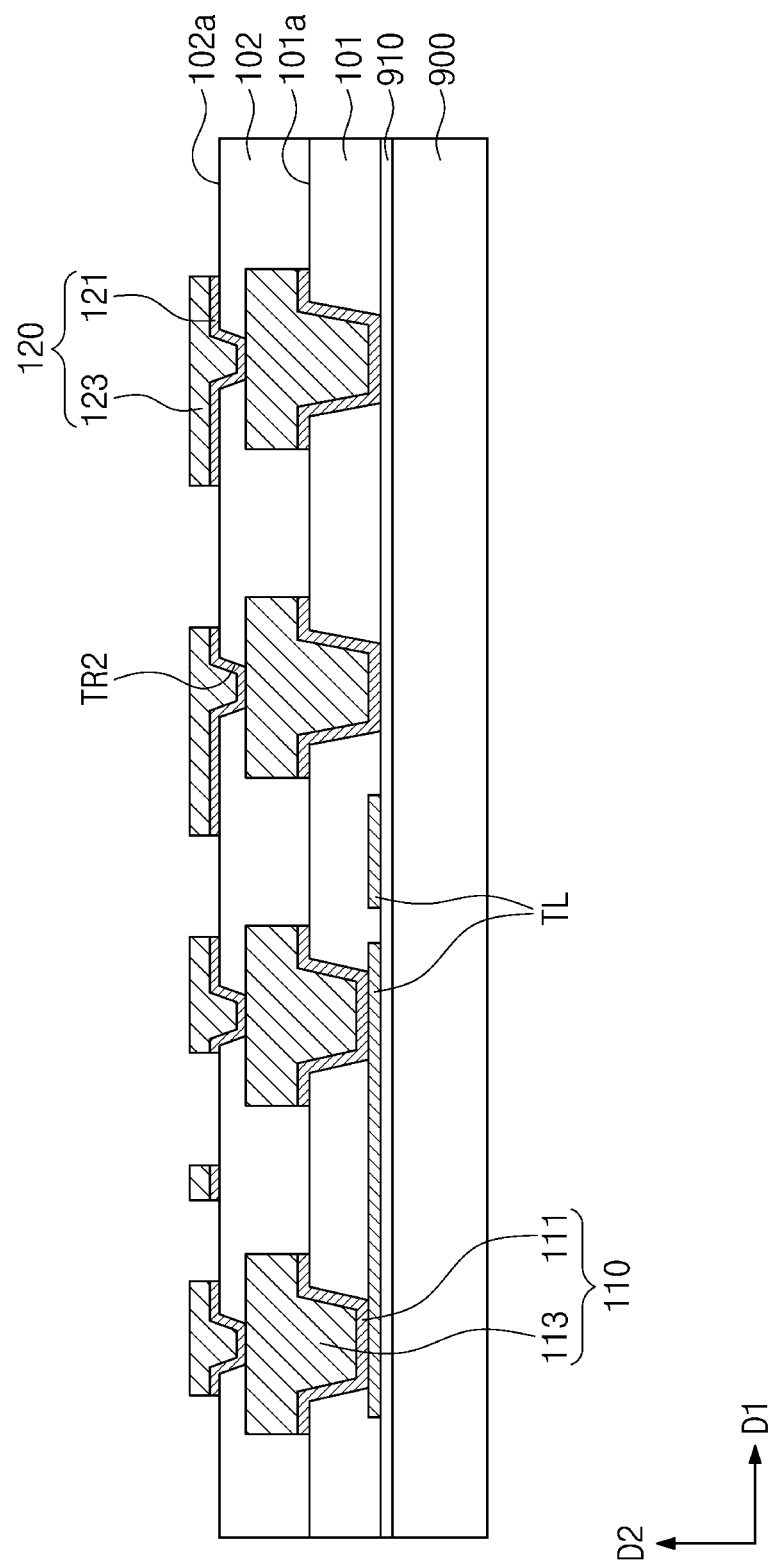
Figure 12:
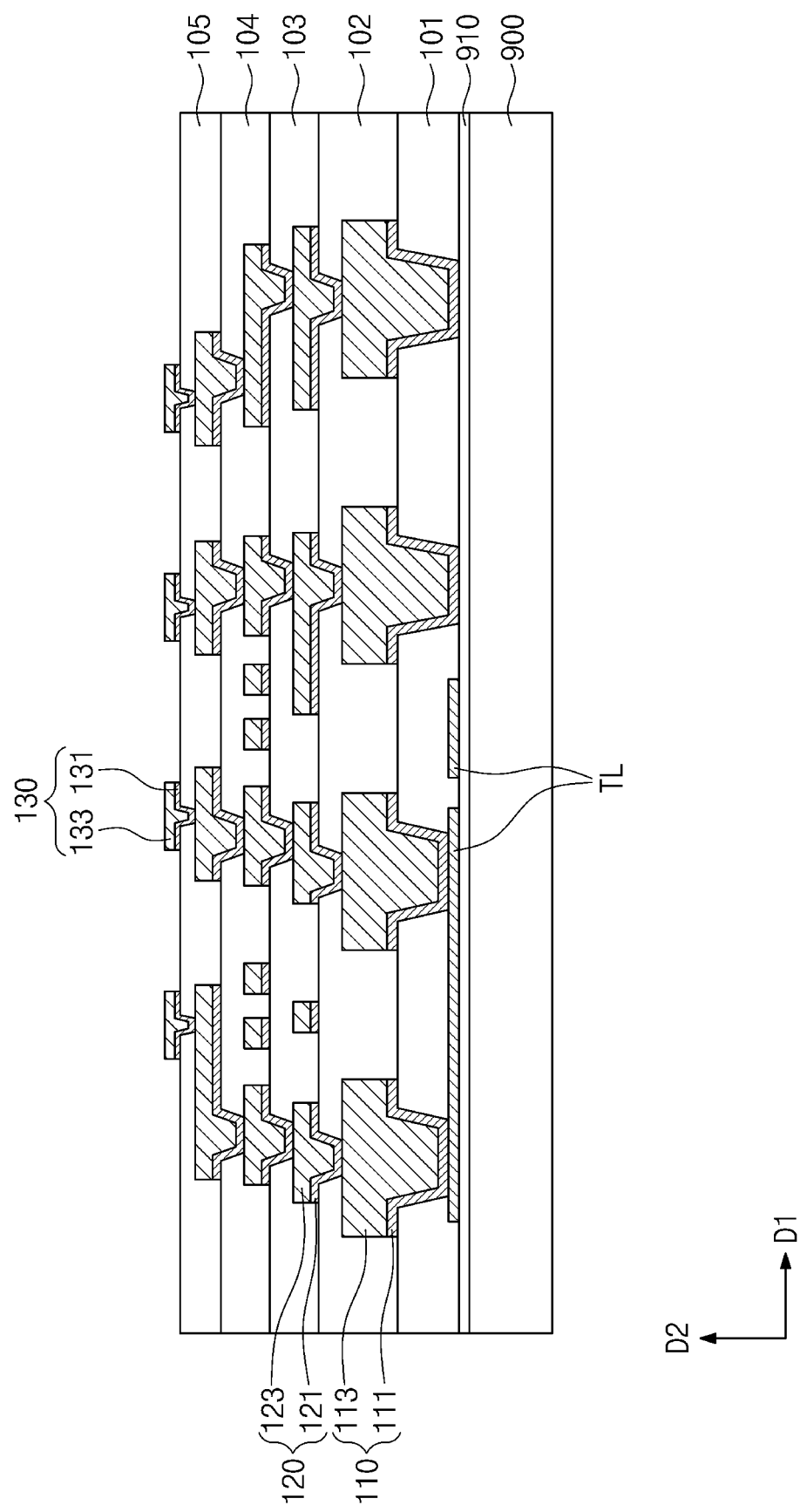

Referring to FIG. 11, the second resist pattern RP2 may be removed to expose the top surface of the second seed layer 121p. In an embodiment, the second resist pattern RP2 may be removed by a strip process. Next, the seed patterns 121 may be formed by removing the exposed portions of the second seed layer 121p. In an embodiment, an etching process may be used to remove the exposed portions of the second seed layer 121p. Accordingly, the redistribution patterns 120 may be formed. The process described with reference to FIGS. 9 to 11 may be performed several times to form the redistribution patterns 120, which are vertically stacked, and the uppermost redistribution patterns 130, as shown in FIG. 12.

Each of the redistribution patterns 120 may include the seed pattern 121 and the conductive pattern 123. The conductive patterns 123 may be disposed on the seed patterns 121, respectively. Each of the redistribution patterns 120 may include the via portion 120V and the wire portion 120W. The via and wire portions 120V and 120W of the redistribution patterns 120 may be the same as those in the embodiment described with reference to FIGS. 1, 2, 3A, and 3B.

Figure 13:
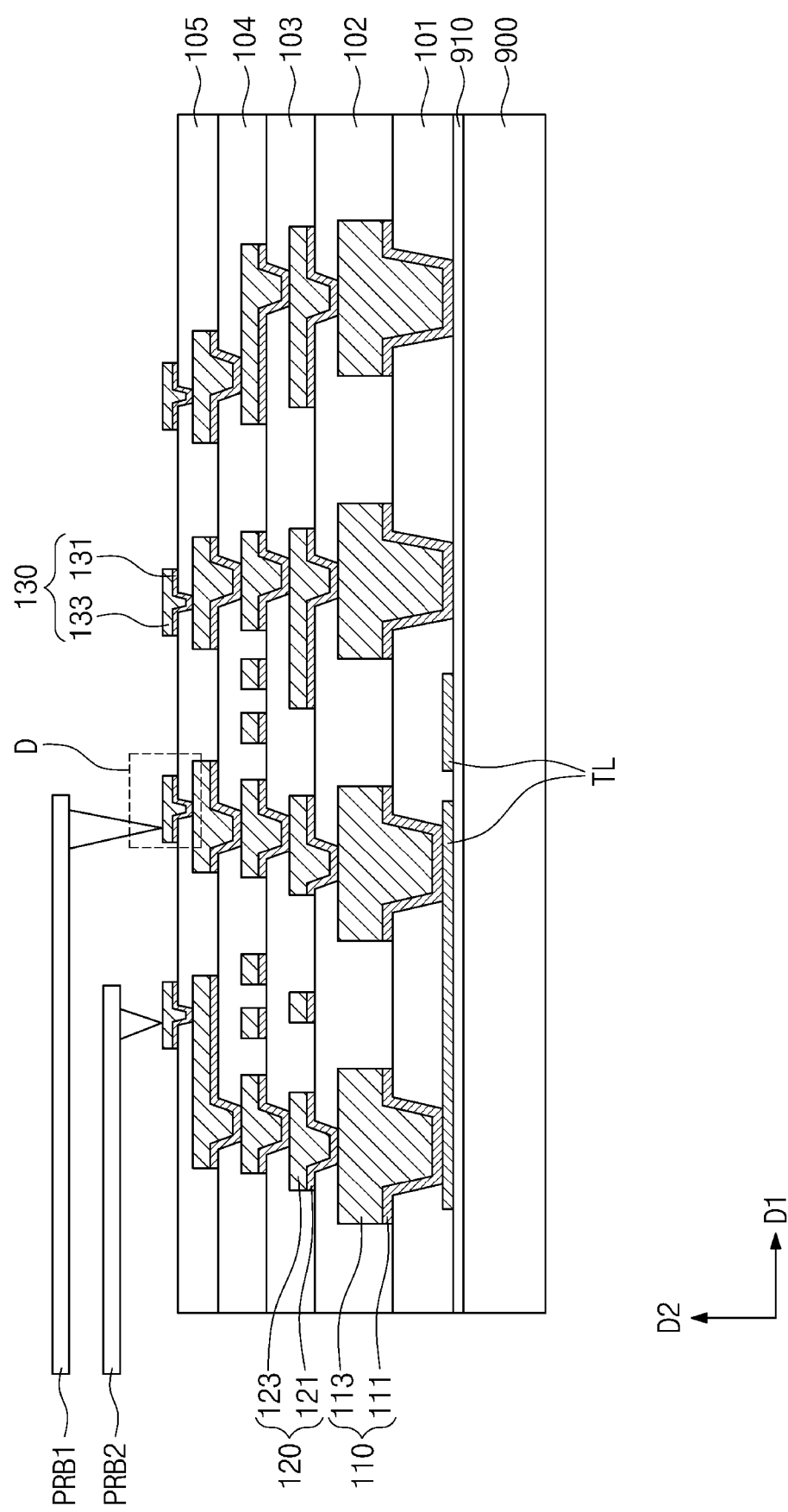
Figure 14:
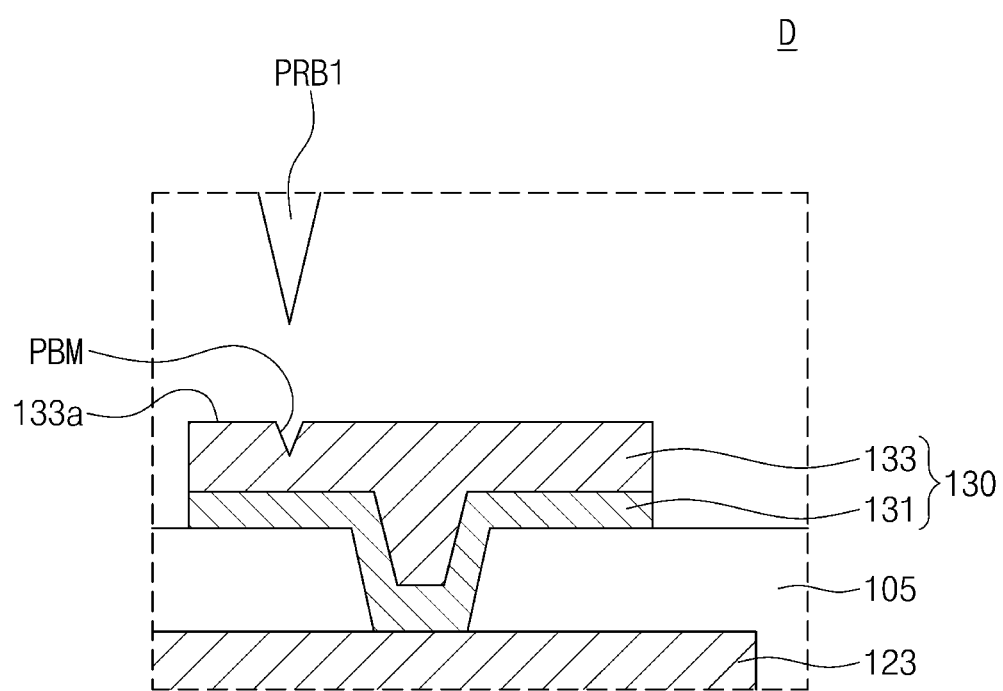
FIG. 14 is an enlarged sectional view of a portion D of FIG. 13.

Referring to FIG. 13, a first test process may be performed on the redistribution patterns 120 and the uppermost redistribution patterns 130. A pair of probes PRB1 and PRB2 may be used in the first test process. The pair of probes PRB1 and PRB2 may be in contact with the top surfaces of the uppermost redistribution patterns 130 electrically connected to the test line TL. An electrical signal, which is input through one probe (e.g., probe PRB1) of the pair of probes PRB1 and PRB2, may be output through the other probe (e.g., probe PRB2) of the pair of probes PRB1 and PRB2 through a corresponding one of the uppermost redistribution patterns 130, the redistribution patterns 120, one of the under-bump patterns 110 in contact with the test line TL, the test line TL, another one of the under-bump patterns 110 in contact with the test line TL, the redistribution patterns 120, and another one of the uppermost redistribution patterns 130. In other words, by measuring a current between the pair of probes PRB1 and PRB2, it may be possible to examine an electrical connection state between the uppermost redistribution patterns 130, the redistribution patterns 120, and the under-bump patterns 110.

Figure 15:
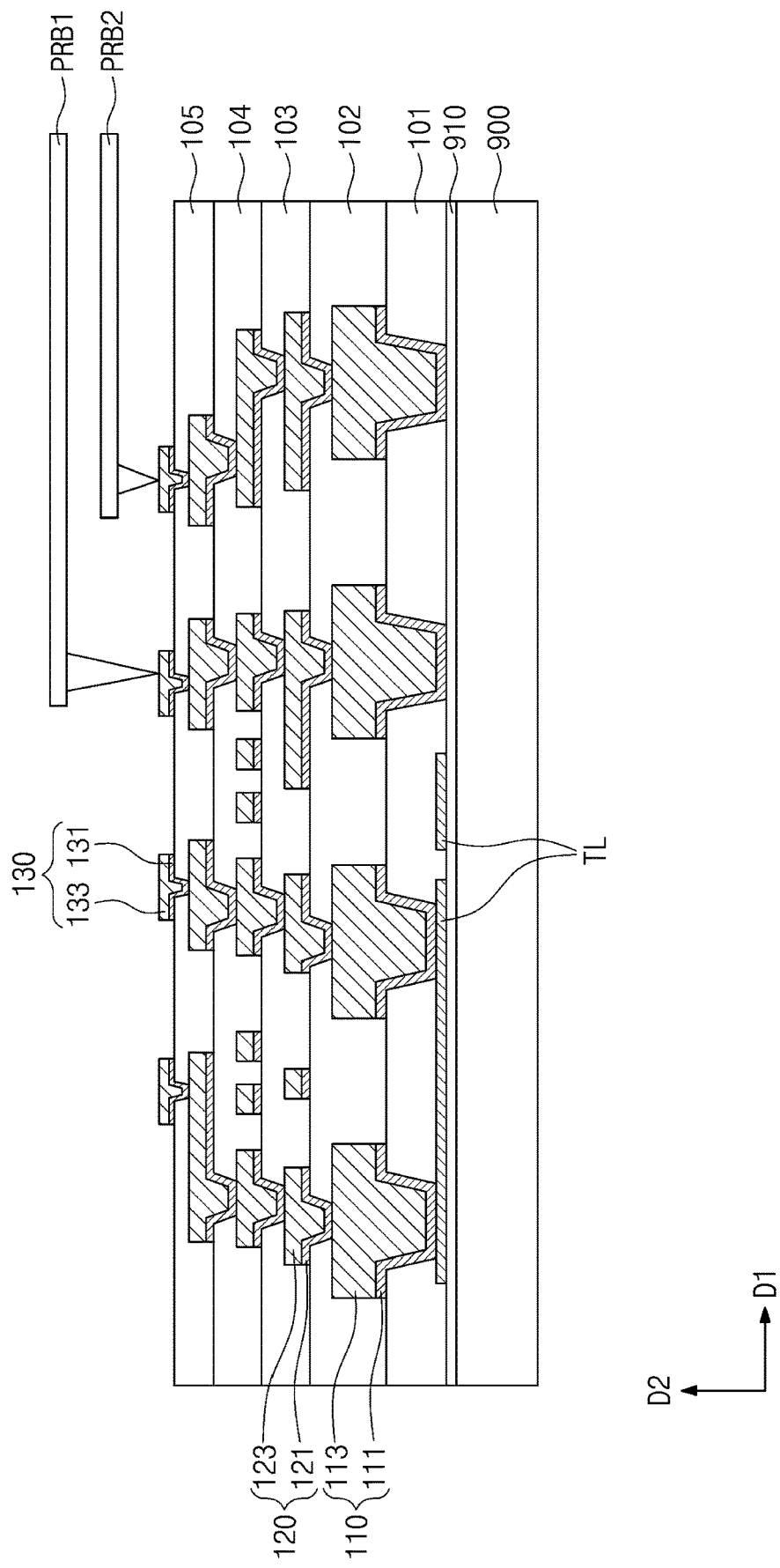

Referring to FIG. 15, a second test process may be performed on the redistribution patterns 120 and the uppermost redistribution patterns 130. In the second test process, the pair of probes PRB1 and PRB2 may be in contact with the top surfaces of the uppermost redistribution patterns 130 that are not electrically connected to the test line TL. Accordingly, an electrical signal, which is input through one probe (e.g., probe PRB1) of the pair of probes PRB1 and PRB2, may not be output through the other probe (e.g., probe PRB2) of the pair of probes PRB1 and PRB2. In other words, by measuring a current between the pair of probes PRB1 and PRB2, it may be possible to examine an electrical insulation state between the uppermost redistribution patterns 130, the redistribution patterns 120, and the under-bump patterns 110.

According to an example embodiment of the inventive concept, the redistribution substrate 100 of a good quality may be selected through the process of testing the contact failure between the uppermost redistribution patterns 130, the redistribution patterns 120, and the under-bump patterns 110. Accordingly, a failed redistribution substrate may be filtered out before a process of mounting the first semiconductor chip 200, and thus, it may be possible to prevent the first semiconductor chip 200 of a good quality from being discarded and thereby to reduce fabrication cost of the product, compared with the case that a failure test process is performed after the fabrication of the semiconductor package 10 is finished.

Referring to FIG. 14, the recessed portion PBM may be formed on the top surface of the uppermost redistribution pattern 130. More specifically, since, in the first and second test processes described with reference to FIGS. 13 and 15, the pair of probes PRB1 and PRB2 are in contact with the top surfaces 133*a* of the uppermost redistribution patterns 130, at least one of the uppermost redistribution patterns 130 may have the top surface 133*a*, in which the recessed portion PBM is formed. The recessed portion PBM may be a probing mark that is formed by a probe tip. For example, a probe tip of one of the pair of probes PRB1 and PRB2 may form the recessed portion PBM in the top surface 133*a* of at least one of the uppermost redistribution patterns 130.

Figure 16:
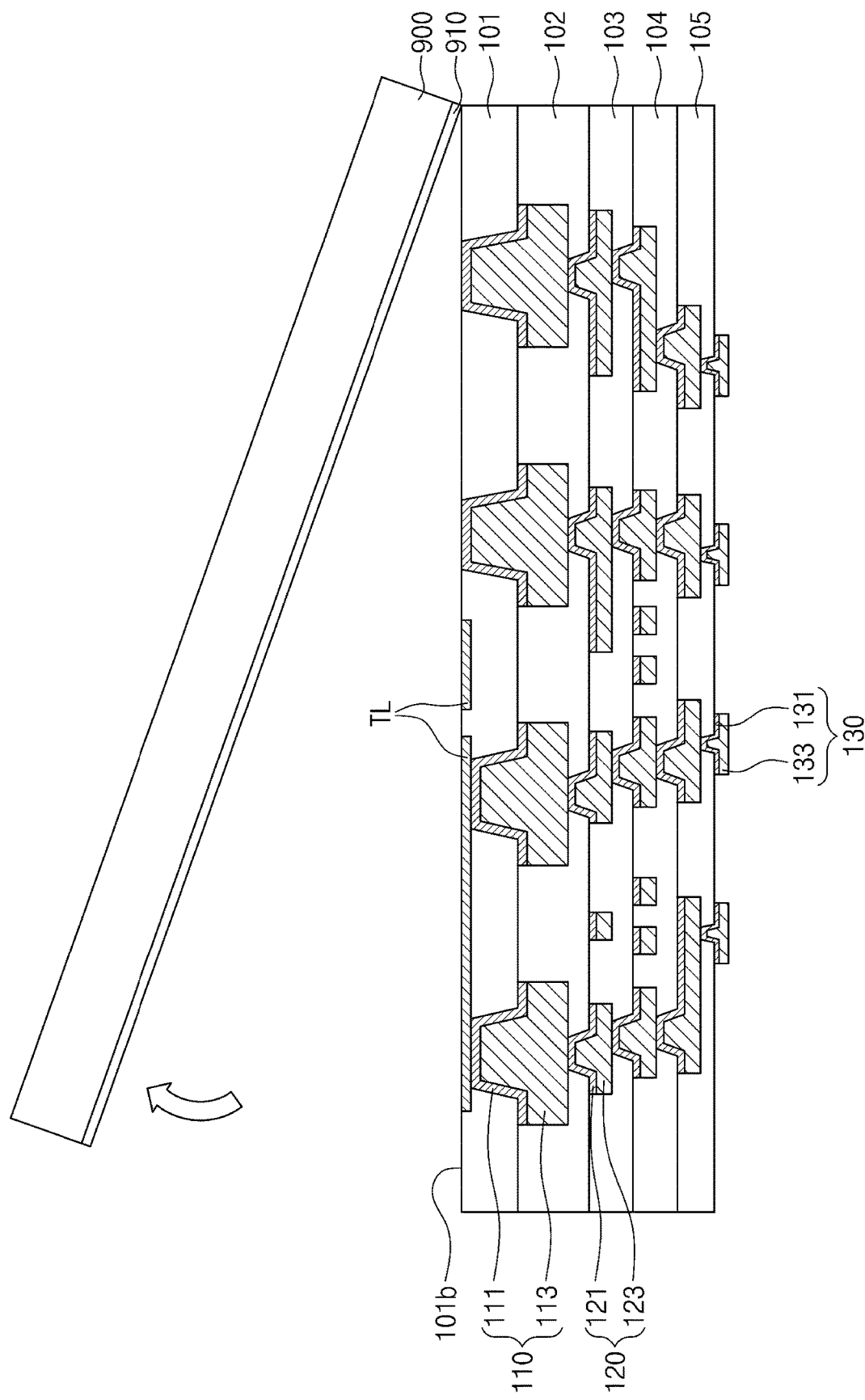

Referring to FIG. 16, the release layer 910 and the carrier substrate 900 may be removed to expose a bottom surface 101*b* of the first insulating layer 101 and the test lines TL to the outside.

Figure 17:
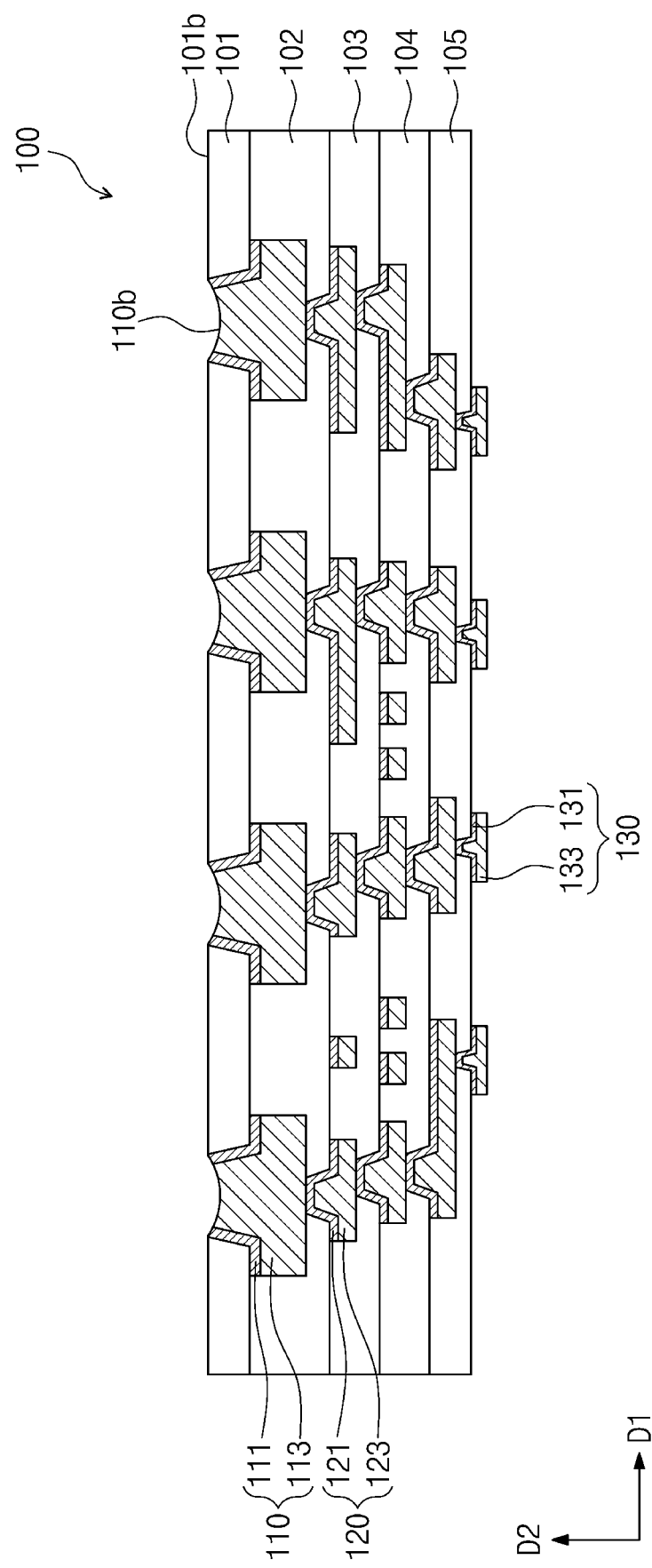

Referring to FIG. 17, a planarization process may be performed on the exposed bottom surface 101*b* of the first insulating layer 101 and the exposed surfaces of the test lines TL to form the redistribution substrate 100. For example, the planarization process may be a chemical-mechanical polishing process (CMP). The planarization process may be performed until the test lines TL are removed. For example, the planarization process may be performed to remove portions of the first insulating layer 101, portions of the via portions 110V of the under-bump patterns 110, and the test lines TL. In an embodiment, as a result of the planarization process, the via portion 110V of each of the under-bump patterns 110 may be more deeply recessed, compared with the first insulating layer 101. Accordingly, the bottom surface 110*b* of the via portion 110V may be a curved surface that is concavely recessed in a direction toward the redistribution patterns 120, unlike the bottom surface 101*b* of the first insulating layer 101.

Referring back to FIG. 1, the first semiconductor chip 200 with the first chip pads 205 may be prepared. The first semiconductor chip 200 may be disposed on the fifth insulating layer 105 such that the first chip pads 205 are aligned to the uppermost redistribution patterns 130, respectively. The chip connection terminals 250 may be formed between the first semiconductor chip 200 and the redistribution substrate 100. The chip connection terminals 250 may be respectively coupled to the first chip pads 205 and the uppermost redistribution patterns 130.

The first under-fill layer 230 may be formed between the first semiconductor chip 200 and the fifth insulating layer 105 to cover the chip connection terminals 250. The mold layer 300 may be formed on the fifth insulating layer 105 to hermetically seal the first semiconductor chip 200.

Figure 18:
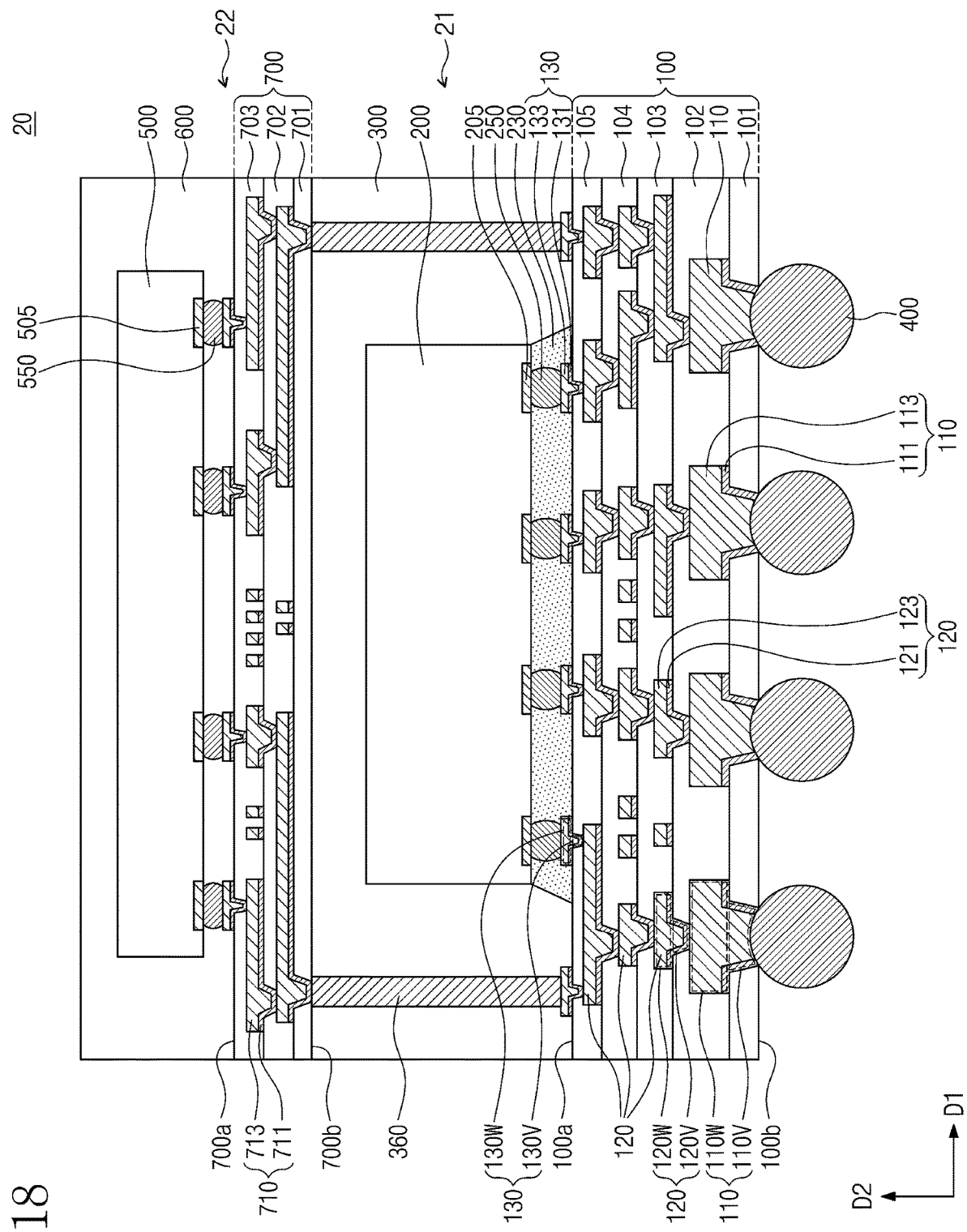
FIG. 18 is a sectional view illustrating a semiconductor package, according to an example embodiment of the inventive concept.

FIG. 18 is a sectional view illustrating a semiconductor package according to an example embodiment of the inventive concept. For concise description, previously described elements may be identified by the same reference numbers without repeating an overlapping description thereof.

Referring to FIG. 18, a semiconductor package 20 may include a lower semiconductor package 21 and an upper semiconductor package 22. The lower semiconductor package 21 may include the first redistribution substrate 100, the conductive terminal 400, the chip connection terminals 250, the first semiconductor chip 200, the mold layer 300, and a conductive post 360. The first redistribution substrate 100, the conductive terminal 400, the chip connection terminals 250, and the mold layer 300 may be the same as the redistribution substrate 100, the conductive terminal 400, the chip connection terminal 250, and the mold layer 300, respectively, described with reference to FIGS. 1 and 2.

The conductive post 360 may be disposed on the top surface of the redistribution substrate 100 and may be coupled to a corresponding one of the uppermost redistribution patterns 130. The conductive post 360 may be horizontally spaced apart from the first semiconductor chip 200. The conductive post 360 may be provided on an edge region of the redistribution substrate 100, when viewed in a plan view. The conductive post 360 may be a metal pillar provided on the redistribution substrate 100. The conductive post 360 may be provided to penetrate the mold layer 300. The conductive post 360 may be electrically connected to the redistribution substrate 100. For example, the conductive post 360 may be electrically connected to the first semiconductor chip 200 or the conductive terminal 400 through the redistribution substrate 100. The conductive post 360 may be formed of or may include at least one of metallic materials (e.g., copper).

The mold layer 300 may be disposed on the top surface 100*a* of the redistribution substrate 100 to cover the first semiconductor chips 200. The mold layer 300 may hermetically cover the side surfaces of the conductive post 360. The mold layer 300 may be provided between the first semiconductor chip 200 and the conductive post 360. The mold layer 300 may expose the top surface of the conductive post 360.

The upper semiconductor package 22 may include a second redistribution substrate 700, a second semiconductor chip 500, and an upper mold layer 600. The second redistribution substrate 700 may include first to third upper insulating layers 701, 702, and 703 and upper redistribution patterns 710. The first to third upper insulating layers 701, 702, and 703 and the upper redistribution patterns 710 of the second redistribution substrate 700 may be the same as the first to fifth insulating layers 101, 102, 103, 104, and 105 and the redistribution patterns 120 of the redistribution substrate 100 described with reference to FIGS. 1 and 2. For example, each of the upper redistribution patterns 710 may include a seed pattern 711 and a conductive pattern 713. The seed pattern 711 and the conductive pattern 713 may be the same as the seed pattern 111 and the conductive pattern 113, respectively, described with reference to FIGS. 1 and 2. A bottom surface 700b of the second redistribution substrate 700 may face the mold layer 300, and an upper surface 700a of the second redistribution substrate 700 may face the upper mold layer 600.

The second semiconductor chip 500 may be mounted on the uppermost ones of the upper redistribution patterns 710. The second semiconductor chip 500 may be a semiconductor chip that is of a kind different from the first semiconductor chip 200 described with reference to FIGS. 1 and 2. For example, the first semiconductor chip 200 may be one of a logic chip, a buffer chip, and a system-on-chip (SOC), and the second semiconductor chip 500 may be one of a logic chip, a memory chip, a buffer chip, and a system-on-chip (SOC), but may be of a different kind from the first semiconductor chip 200. The second semiconductor chip 500 may include chip pads 505, and chip connection terminals 550 may be provided between the chip pads 505 and the uppermost ones of the upper redistribution patterns 710. The chip connection terminals 550 may be the same as the chip connection terminals 250 described with reference to FIG. 1.

The upper mold layer 600 may be provided on the second redistribution substrate 700. The upper mold layer 600 may include the same material as the mold layer 300. The upper mold layer 600 may cover the top surface and side surfaces of the second semiconductor chip 500 and may seal the chip connection terminals 550. Side surfaces of the upper mold layer 600 may be vertically and respectively aligned to the side surfaces of the second redistribution substrate 700, but the inventive concept is not limited to this example or a specific embodiment.

Figure 19:
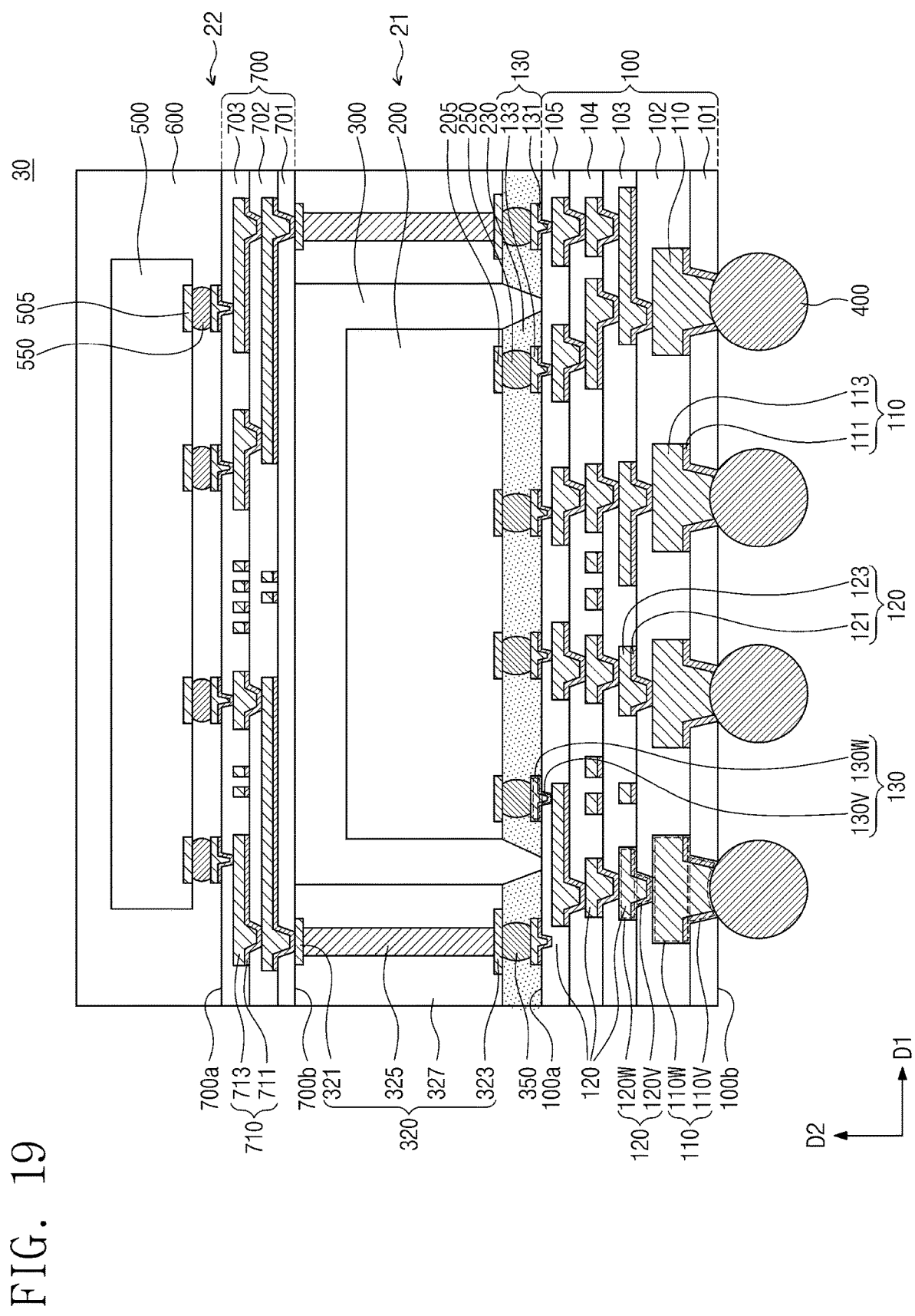
FIG. 19 is a sectional view illustrating a semiconductor package, according to an example embodiment of the inventive concept.

FIG. 19 is a sectional view illustrating a semiconductor package according to an example embodiment of the inventive concept. For concise description, previously described elements may be identified by the same reference numbers without repeating an overlapping description thereof.

Referring to FIG. 19, a semiconductor package 30 may include the lower semiconductor package 21 and the upper semiconductor package 22. The lower semiconductor package 21 may include the first redistribution substrate 100, the conductive terminal 400, the chip connection terminals 250, intermediate connection terminals 350, the first semiconductor chip 200, the mold layer 300, and an intermediate substrate 320.

The first redistribution substrate 100, the conductive terminal 400, the chip connection terminals 250, the first semiconductor chip 200, and the mold layer 300 may be the same as the redistribution substrate 100, the conductive terminal 400, the chip connection terminals 250, and the mold layer 300 described with reference to FIGS. 1 and 2. The upper semiconductor package 22 may be the same as the upper semiconductor package 22 described with reference to FIG. 18. However, in the present embodiment, conductive structures 321, 323, and 325 may be provided in the intermediate substrate 320, and the lowermost ones of the upper redistribution patterns 710 of the second redistribution substrate 700 may be in contact with the pads 321 of the conductive structures 321, 323, and 325.

The intermediate substrate 320 may be disposed on the first redistribution substrate 100. The intermediate substrate 320 may have a substrate hole which is formed to penetrate the same. As an example, the intermediate substrate 320 may be fabricated by forming the substrate hole to completely penetrate a printed circuit board in a vertical direction. When viewed in a plan view, the substrate hole may be formed in the center region of the first redistribution substrate 100. The first semiconductor chip 200 may be disposed in the substrate hole of the intermediate substrate 320. The first semiconductor chip 200 may be spaced apart from an inner side surface of the intermediate substrate 320.

The intermediate substrate 320 may include a base layer 327 and the conductive structures 321, 323, and 325. The base layer 327 may be a single layer or a multi-layered structure including a plurality of stacked layers. The base layer 327 may be formed of or may include at least one of insulating materials. For example, the base layer 327 may be formed of or may include at least one of carbon-based materials, ceramics, or polymers. The substrate hole may be provided to penetrate the base layer 327. The conductive structures 321, 323, and 325 may be provided in the base layer 327. The conductive structures 321, 323, and 325 may include pads 321 and 323 and vias 325. The pads 321 and 323 may be formed on the bottom or top surface of the intermediate substrate 320 and may be exposed to the outside of the intermediate substrate 320. The vias 325 may be provided between the pads 321 and 323. The vias 325 may be provided to penetrate the base layer 327 and may be coupled to the pads 321 and 323. The pads 321 and 323 and the vias 325 may be vertically aligned to each other, but the inventive concept is not limited to this example. The conductive structures 321, 323, and 325 may be formed of or may include at least one of metallic materials. The conductive structures 321, 323, and 325 may be formed of or may include at least one of, for example, copper, aluminum, tungsten, titanium, tantalum, iron, or alloys thereof.

The intermediate connection terminals 350 may be disposed between the first redistribution substrate 100 and the intermediate substrate 320. The intermediate connection terminals 350 may be respectively interposed between and coupled to the pads 323 and the uppermost redistribution patterns 130. The conductive structures 321, 323, and 325 may be electrically connected to the first redistribution substrate 100 through the intermediate connection terminals 350. The intermediate connection terminals 350 may include at least one of a solder ball, a solder pillar, or a solder bump. The intermediate connection terminals 350 may be formed of or may include at least one of metallic materials. An under-fill layer may be provided in a gap region between the first redistribution substrate 100 and the intermediate substrate 320 to seal the intermediate connection terminals 350. The under-fill layer may be formed of or may include an insulating polymer.

Figure 20:
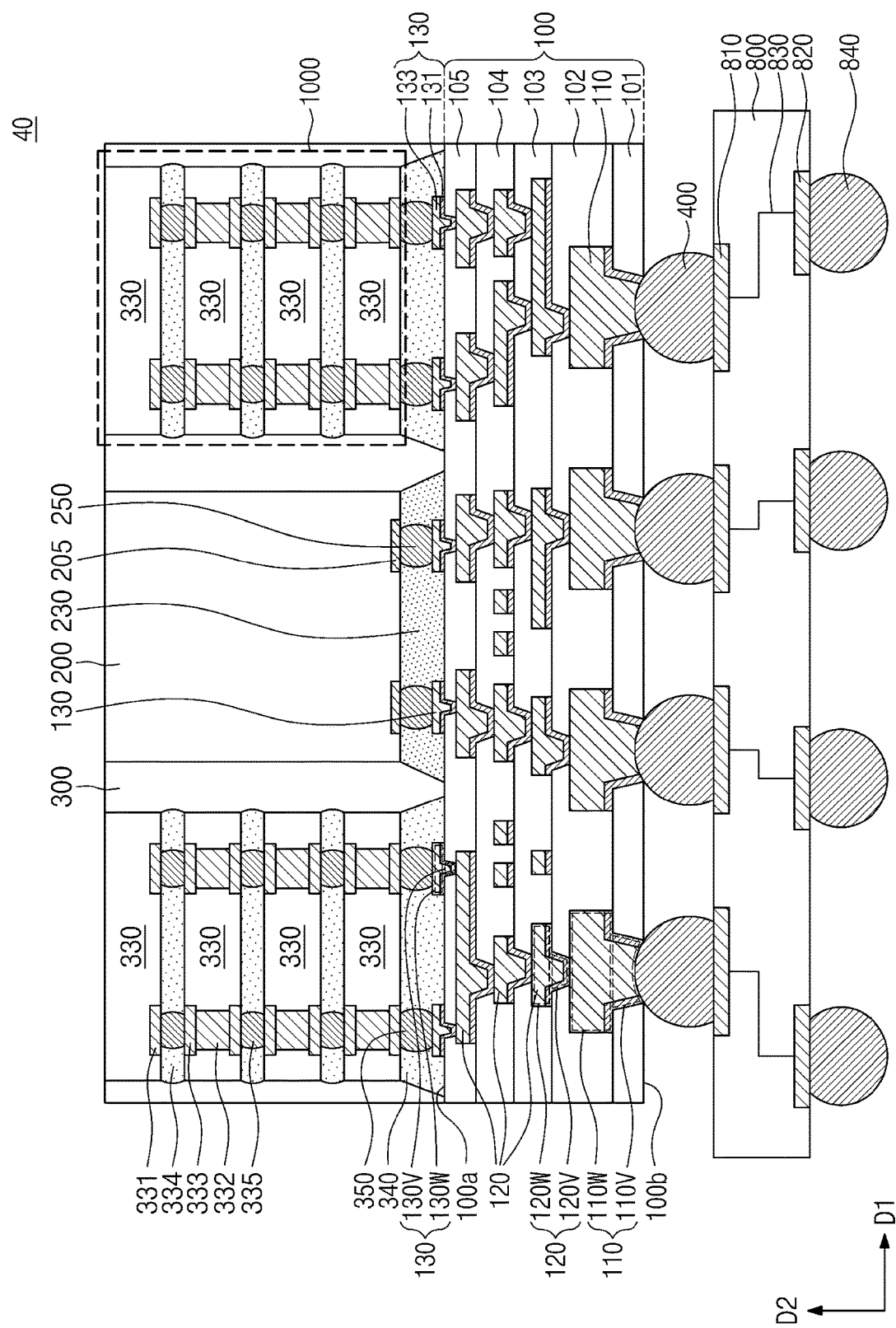
FIG. 20 is a sectional view illustrating a semiconductor package, according to an example embodiment of the inventive concept.

FIG. 20 is a sectional view illustrating a semiconductor package according to an example embodiment of the inventive concept. For concise description, previously described elements may be identified by the same reference numbers without repeating an overlapping description thereof.

Referring to FIG. 20, a semiconductor package 40 may include a package substrate 800, the redistribution substrate 100, the conductive terminal 400, the first semiconductor chip 200, a chip stack 1000, and the mold layer 300. The redistribution substrate 100, the conductive terminal 400 and the mold layer 300 may be the same as those described with reference to FIGS. 1 and 2.

The package substrate 800 may include a printed circuit board. The package substrate 800 may include a metal line 830 and metal pads 810 and 820. The metal pads 810 and 820 may include an upper metal pad 810 and a lower metal pad 820. The metal line 830 may be provided in the package substrate 800. In the present specification, the expression "an element is coupled or connected to the package substrate 800" may mean that the element is coupled or connected to the metal line 830. The upper metal pad 810 may be provided on a top surface of the package substrate 800 and may be electrically connected to the metal line 830. The lower metal pad 820 may be provided on a bottom surface of the package substrate 800 and may be electrically connected to the metal line. Outer coupling terminals 840 may be provided on the bottom surface of the package substrate 800 and may be coupled to the lower metal pads 820, respectively. External electrical signals may be transferred to the metal lines 830 through the outer coupling terminals 840. Solder balls may be used as the outer coupling terminals 840. The outer coupling terminals 840 may be formed of or may include at least one of metallic materials (e.g., solder materials).

The redistribution substrate 100 may be disposed on the package substrate 800. The redistribution substrate 100 may serve as an interposer substrate. The conductive terminal 400 may be aligned to and coupled to the upper metal pad 810 of the package substrate 800. The redistribution substrate 100 may be electrically connected to the package substrate 800 through the conductive terminal 400. The redistribution substrate 100 may be the same as the redistribution substrate 100 described with reference to FIGS. 1 and 2.

The first semiconductor chip 200 may be mounted on the top surface 100a of the redistribution substrate 100. For example, the first chip connection terminals 250 may be provided between the first chip pads 205 of the first semiconductor chip 200 and the uppermost redistribution patterns 130. The first semiconductor chip 200 may be configured to have the same features as the first semiconductor chip 200 of FIGS. 1 and 2, and the first chip connection terminals 250 may be configured to have the same arrangement, function, and material as the chip connection terminals 250 described with reference to FIGS. 1 and 2.

The chip stack 1000 may be mounted on the top surface of the redistribution substrate 100. The chip stack 1000 may be spaced apart from the first semiconductor chip 200 in a horizontal direction. The chip stack 1000 may include a plurality of second semiconductor chips 330, which are stacked on the redistribution substrate 100. Each of the second semiconductor chips 330 may be configured to have the same features as the first semiconductor chip 200 of FIGS. 1 and 2. However, the second semiconductor chip 330 may be a semiconductor chip that is of a kind different from the first semiconductor chip 200. For example, the first semiconductor chip 200 may be one of a logic chip, a buffer chip, and a system-on-chip (SOC), and the second semiconductor chip 330 may be one of a logic chip, a memory chip, a buffer chip, and a system-on-chip (SOC) but may be of a different kind from the first semiconductor chip 200. In the present specification, the memory chip may include a high bandwidth memory (HBM) chip. As an example, the first semiconductor chip 200 may be a logic chip, and the second semiconductor chips 330 may be high bandwidth memory (HBM) chips. As another example, the lowermost one of the second semiconductor chips 330 may be a logic chip, and the others of the second semiconductor chips 330 may be high bandwidth memory chips.

Each of the second semiconductor chips 330 may include a lower pad 331, a penetration electrode 332, and an upper pad 333. The lower and upper pads 331 and 333 may be respectively provided on bottom and top surfaces of the second semiconductor chip 330. At least one of the lower and upper pads 331 and 333 may be electrically connected to integrated circuits in the second semiconductor chip 330. The penetration electrode 332 may be provided in the second semiconductor chip 330 and may be coupled to the lower and upper pads 331 and 333. In an embodiment, the uppermost one of the second semiconductor chips 330 may include the lower pad 331 but may not include the penetration electrode 332 and the upper pad 333. Unlike the structure illustrated in FIG. 20, in some embodiments, the uppermost one of the second semiconductor chips 330 may further include the penetration electrode 332 and the upper pad 333. An interposer terminal 335 may be interposed between two adjacent ones of the second semiconductor chips 330 and may be coupled to the respective lower and upper pads 331 and 333 of the two adjacent ones of the second semiconductor chips 330. Accordingly, the second semiconductor chips 330 may be electrically connected to each other. The interposer terminal 335 may include a solder ball, a solder pillar, or a solder bump. The interposer terminal 335 may be formed of or may include a solder material, but the inventive concept is not limited to this example.

As another example, the interposer terminal 335 may be omitted. In this case, the lower and upper pads 331 and 333, which are respectively provided in adjacent ones of the second semiconductor chips 330 to face each other, may be directly bonded to each other.

The second chip connection terminals 350 may be interposed between the lowermost one of the second semiconductor chips 330 and the redistribution substrate 100 and may be respectively coupled to the lower pads 331 and the uppermost redistribution patterns 130. Accordingly, the second semiconductor chips 330 may be electrically connected to the first semiconductor chip 200 and the conductive terminal 400 through the redistribution substrate 100. The second chip connection terminals 350 may be configured to have the same arrangement, function, and material as the chip connection terminals 250 described with reference to FIGS. 1 and 2.

In an embodiment, a plurality of the chip stacks 1000 may be provided. The chip stacks 1000 may be spaced apart from each other in a horizontal direction. The first semiconductor chip 200 may be disposed between the chip stacks 1000. Accordingly, lengths of electrical paths between the first semiconductor chip 200 and the chip stacks 1000 may be reduced.

The first under-fill layer 230 may be provided in a first gap region between the redistribution substrate 100 and the first semiconductor chip 200 to seal the first chip connection terminals 250. The first under-fill layer 230 may be formed of or may include at least one of insulating polymers (e.g., epoxy-based polymers). A second under-fill layer 340 may be provided in each of second gap regions between the redistribution substrate 100 and the chip stacks 1000 to seal corresponding ones of the second chip connection terminals 350. The second under-fill layer 340 may be formed of or may include at least one of insulating polymers (e.g., epoxy-based polymers). In an embodiment, although not shown, a single under-fill pattern may be provided in the first and second gap regions to seal the first chip connection terminals 250 and the second chip connection terminals 350.

A third under-fill layer 334 may be provided between the second semiconductor chips 330 to seal the interposer terminal 335. The third under-fill layer 334 may be formed of or may include at least one of insulating polymers (e.g., epoxy-based polymers).

The mold layer 300 may be disposed on the redistribution substrate 100 to cover the side surface of the first semiconductor chip 200 and the side surfaces of the second semiconductor chips 330. The mold layer 300 may be provided to expose the top surface of the first semiconductor chip 200 and the top surface of the uppermost one of the second semiconductor chips 330. Alternatively, the mold layer 300 may cover the top surface of the first semiconductor chip 200 and the top surface of the uppermost one of the second semiconductor chips 330. In an embodiment, the first under-fill layer 230 and the second under-fill layer 340 may be omitted, and the mold layer 300 may be extended into the first and second gap regions.

Although not shown, a conductive plate may be further disposed on the top surface of the first semiconductor chip 200, the top surface of the chip stack 1000, and the top surface of the mold layer 300. The conductive plate may be further extended onto the side surface of the mold layer 300. The conductive plate may protect the first semiconductor chip 200 and the chip stack 1000 from the outside. For example, the conductive plate may prevent an impurity contamination issue or may absorb a physical impact. The conductive plate may be formed of or may include a material having high thermal conductivity, and in this case, the conductive plate may be used as a heat sink or a heat slug, or a heat spreader. For example, the conductive plate may be used to exhaust heat, which is produced from the redistribution substrate 100, the first semiconductor chip 200, or the second semiconductor chips 330 during operations of the semiconductor package, to the outside. Since the conductive plate has an electrically conductive property, it can be used as an electromagnetic wave shielding layer. For example, the conductive plate may prevent an electromagnetic interference (EMI) between the first and second semiconductor chips 200 and 330. The conductive plate may be grounded through the redistribution substrate 100 to prevent the first or second semiconductor chip 200 or 330 from being electrically damaged by an electrostatic discharge (ESD) phenomenon.

Although not shown, a third semiconductor chip may be additionally mounted on the redistribution substrate 100. The third semiconductor chip may be a semiconductor chip that is of a kind different from the first and second semiconductor chips 200 and 330.

According to an embodiment of the inventive concept, an under-bump pattern with a wire portion and a via portion may be provided, and here, a bottom surface of the under-bump pattern may have a curved surface. Thus, the under-bump patterns may be coupled to conductive terminals with improved connection property.

According to an embodiment of the inventive concept, a test process may be performed to examine whether there is a failure in a redistribution substrate, before mounting a semiconductor chip on the redistribution substrate. Thus, it may be possible to preselect a good-quality redistribution substrate and thereby to prevent a good-quality semiconductor chip from being discarded.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor package, comprising:
a redistribution substrate;
a semiconductor chip mounted on a top surface of the redistribution substrate; and
a conductive terminal provided on a bottom surface of the redistribution substrate,
wherein the redistribution substrate comprises:
an under-bump pattern including a via portion in contact with the conductive terminal and a wire portion on the via portion; and
an insulating layer covering top and side surfaces of the under-bump pattern, and
wherein a central portion of a bottom surface of the via portion is provided at a level higher than an edge portion of the bottom surface of the via portion,
wherein the bottom surface of the via portion is curvedly recessed in a direction toward the wire portion,
wherein the via portion comprises a seed pattern and a conductive pattern on the seed pattern, and
wherein the conductive terminal contacts the seed pattern and the conductive pattern of the via portion.

2. The semiconductor package of claim 1, wherein the central portion of the bottom surface of the via portion is provided at a level higher than the bottom surface of the redistribution substrate.

3. The semiconductor package of claim 2, wherein a vertical distance from the bottom surface of the redistribution substrate to the central portion of the bottom surface of the via portion is in a range of 500 nm to 1 μm.

4. The semiconductor package of claim 2, wherein a ratio of a vertical distance, which is a distance from the bottom surface of the redistribution substrate to the central portion of the bottom surface of the via portion, to a width of the via portion is in a range of 0.01 to 0.2.

5. The semiconductor package of claim 1,
wherein the redistribution substrate further comprises a redistribution pattern provided on the under-bump pattern,
wherein the under-bump pattern comprises a conductive pattern, which is interposed between the conductive terminal and the redistribution pattern, and a seed pattern, which is provided between the conductive pattern and the insulating layer, and
wherein the conductive pattern is in direct contact with the conductive terminal.

6. The semiconductor package of claim 5, wherein an interface between the conductive terminal and the conductive pattern is convexly curved toward the wire portion of the under-bump pattern.

7. The semiconductor package of claim 1, wherein a vertical distance from the bottom surface of the redistribution substrate to the top surface of the under-bump pattern is in a range of 15 μm to 25 μm.

8. The semiconductor package of claim 1, wherein the topmost portion of the conductive terminal is located at a level higher than the bottom surface of the redistribution substrate.

9. The semiconductor package of claim 1,
wherein the redistribution substrate further comprises a redistribution pattern provided on the under-bump pattern, and
wherein a ratio of a height of the redistribution pattern to a height of the under-bump pattern is in a range of 0.1 to 0.2.

10. The semiconductor package of claim 1, wherein a ratio of a width of the via portion to a width of the wire portion of the under-bump pattern is in a range of 0.7 to 0.8.

11. A semiconductor package, comprising:
a redistribution substrate;
a semiconductor chip mounted on a top surface of the redistribution substrate; and
a conductive terminal provided on a bottom surface of the redistribution substrate, wherein the redistribution substrate comprises:
an under-bump pattern including a first via portion in contact with the conductive terminal and a wire portion on the first via portion;
an insulating layer contacting a side surface of the under-bump pattern; and
redistribution patterns provided on the under-bump pattern,
wherein the uppermost redistribution patterns of the redistribution patterns are connected to the semiconductor chip,
wherein at least one of the uppermost redistribution patterns comprises a second via portion and a pad portion on the second via portion,
wherein the wire portion comprises a seed pattern and a conductive pattern on the seed pattern,
wherein side surfaces of the seed pattern and the conductive pattern of the wire portion are aligned in a vertical direction,
wherein the bottom surface of the first via portion is curvedly recessed in a direction toward the wire portion,
wherein the conductive terminal contacts the seed pattern and the conductive pattern of the first via portion of the under-bump pattern,
wherein an uppermost surface of the conductive terminal is at a higher level than a lowermost surface of the insulating layer, and
wherein only a top surface of the conductive pattern of the pad portion of the at least one of the uppermost redistribution patterns includes a recessed portion.

12. The semiconductor package of claim 11, wherein a depth of the recessed portion is in a range of 500 nm to 1 μm.

13. The semiconductor package of claim 11, wherein the largest width of the recessed portion is in a range of 200 nm to 300 nm.

14. The semiconductor package of claim 11, further comprising:
a chip connection terminal interposed between the semiconductor chip and the at least one of the uppermost redistribution patterns,
wherein the chip connection terminal is extended into the recessed portion.

15. The semiconductor package of claim 11, further comprising:
an insulating layer covering top and side surfaces of the under-bump pattern,
wherein the under-bump pattern comprises a conductive pattern, which is interposed between the conductive terminal and the redistribution patterns, and a seed pattern, which is provided between the conductive pattern and the insulating layer, and
wherein each of the conductive pattern and the seed pattern of the under-bump pattern is in physical contact with the conductive terminal.

16. The semiconductor package of claim 15, wherein the seed pattern of the under-bump pattern is provided to expose at least a portion of a bottom surface of the conductive pattern of the under-bump pattern adjacent to the conductive terminal.

17. A semiconductor package, comprising:
a redistribution substrate;
a semiconductor chip mounted on a top surface of the redistribution substrate;
a chip connection terminal provided between the redistribution substrate and the semiconductor chip;
an under-fill layer surrounding the chip connection terminal;
a mold layer covering side and top surfaces of the semiconductor chip and side surfaces of the under-fill layer; and
a conductive terminal provided on a bottom surface of the redistribution substrate,
wherein the redistribution substrate comprises:
an under-bump pattern including a via portion in contact with the conductive terminal and a wire portion on the via portion;
redistribution patterns provided on the under-bump pattern; and
an insulating layer covering the under-bump pattern and the redistribution patterns,
wherein each of the redistribution patterns comprises a via portion, which is in contact with another one of the redistribution patterns adjacent thereto or the under-bump pattern, and a wire portion, which is provided on the via portion,
wherein a central portion of a bottom surface of the via portion of the under-bump pattern is provided at a level higher than an edge portion of the bottom surface of the via portion of the under-bump pattern,
wherein the bottom surface of the via portion is curvedly recessed in a direction toward the wire portion,
wherein the via portion comprises a seed pattern and a conductive pattern on the seed pattern, and
wherein the conductive terminal contacts the seed pattern and the conductive pattern of the via portion.

* * * * *